United States Patent
Song et al.

(10) Patent No.: US 12,306,483 B2
(45) Date of Patent: May 20, 2025

(54) SUBSTRATE AND METHOD FOR CUTTING THE SAME, AND ELECTRONIC DEVICE AND ELECTRONIC APPARATUS

(71) Applicants: BOE (Hebei) Mobile Display Technology Co., Ltd., Hebei (CN); BOE TECHNOLOGY GROUP CO., LTD., Beijing (CN)

(72) Inventors: Chunlei Song, Beijing (CN); Lei Zeng, Beijing (CN); Wenliang Wang, Beijing (CN); Liangliang Zheng, Beijing (CN)

(73) Assignees: BOE (Hebei) Mobile Display Technology Co., Ltd., Hebei (CN); BOE TECHNOLOGY GROUP CO., LTD., Beijing (CN)

( * ) Notice: Subject to any disclaimer, the term of this patent is extended or adjusted under 35 U.S.C. 154(b) by 408 days.

(21) Appl. No.: 17/780,053

(22) PCT Filed: Apr. 13, 2021

(86) PCT No.: PCT/CN2021/086832
§ 371 (c)(1),
(2) Date: May 26, 2022

(87) PCT Pub. No.: WO2021/238468
PCT Pub. Date: Dec. 2, 2021

(65) Prior Publication Data
US 2022/0413325 A1 Dec. 29, 2022

(30) Foreign Application Priority Data
May 29, 2020 (CN) .......................... 202010480020.9

(51) Int. Cl.
*G02F 1/13* (2006.01)
*B23K 26/38* (2014.01)
*B23K 26/70* (2014.01)

(52) U.S. Cl.
CPC ............ *G02F 1/1303* (2013.01); *B23K 26/38* (2013.01); *B23K 26/702* (2015.10)

(58) Field of Classification Search
CPC ...... G02F 1/1303; B23K 26/702; B23K 26/38
(Continued)

(56) References Cited

U.S. PATENT DOCUMENTS 8,654,304 B2  2/2014 Lee et al.
2010/0301521 A1* 12/2010 Uchiyama .............. B23K 26/40
                                                         264/400
(Continued)

FOREIGN PATENT DOCUMENTS

CN  103030266 A  4/2013
CN  109702357 A  5/2019
(Continued)

OTHER PUBLICATIONS

PCT International Search Report (w/ English translation) and Written Opinion for corresponding PCT Application No. PCT/CN2021/086832, mailed on Jul. 20, 2021, 12 pages.

*Primary Examiner* — Kwin Xie
(74) *Attorney, Agent, or Firm* — Dority & Manning, P.A.

(57) ABSTRACT

A substrate includes at least two edges; and at least one end portion, each end portion is connected to two adjacent edges. The end portion includes a cutting section and two breaking sections; an end of the cutting section is connected to one of the two adjacent edges through a breaking section, and another end of the cutting section is connected to another one of the two adjacent edges through another breaking section. The cutting section is configured to be formed through cutting of a tool, and the breaking sections are configured to be formed under an action of a physical force.

18 Claims, 14 Drawing Sheets

(58) Field of Classification Search
USPC .......................................................... 345/206
See application file for complete search history.

(56) References Cited

U.S. PATENT DOCUMENTS

| | | |
|---|---|---|
| 2012/0181264 A1 | 7/2012 | Stura et al. |
| 2013/0068737 A1* | 3/2013 | Saito ........................ B28D 5/00 |
| | | 219/121.72 |
| 2015/0191388 A1* | 7/2015 | Abramov .............. C03B 33/091 |
| | | 65/161 |
| 2016/0033841 A1* | 2/2016 | Gauthier ................. G02F 1/161 |
| | | 219/121.72 |
| 2016/0362325 A1 | 12/2016 | Dong et al. |
| 2018/0200830 A1* | 7/2018 | Yodo ....................... B23K 26/57 |
| 2020/0070285 A1* | 3/2020 | Kang ..................... B23K 26/38 |
| 2021/0399185 A1 | 12/2021 | Liu et al. |

FOREIGN PATENT DOCUMENTS

| | | | |
|---|---|---|---|
| CN | 110147003 A | 8/2019 | |
| CN | 110497101 A | 11/2019 | |
| CN | 110765609 A | 2/2020 | |
| CN | 212577823 U | 2/2021 | |
| JP | 2013082589 A | 5/2013 | |
| KR | 20120119082 A | 10/2012 | |
| KR | 20140122312 A | 10/2014 | |

* cited by examiner

SUBSTRATE AND METHOD FOR CUTTING THE SAME, AND ELECTRONIC DEVICE AND ELECTRONIC APPARATUS

CROSS-REFERENCE TO RELATED APPLICATIONS

This application is a national phase entry under 35 USC 371 of International Patent Application No. PCT/CN2021/086832, filed on Apr. 13, 2021, which claims priority to Chinese Patent Application No. 202010480020.9, filed on May 29, 2020, which are incorporated herein by reference in their entirety.

TECHNICAL FIELD

Embodiments of the present disclosure relate to a substrate and a method for cutting the same, an electronic device, and an electronic apparatus.

BACKGROUND

In a process of manufacturing a substrate, in the related art, a substrate motherboard is first cut into a plurality of separate substrates using a cutter wheel, and then a corner of the substrate is cut using laser light through an outer cutting process. The outer cutting process means that the laser light is used to directly cut the substrate from an edge of the substrate to another edge of the substrate, so that the corner of the substrate is cut off. However, since the substrate is provided with electronic elements therein, when the laser light cuts to the edge of the substrate, the edge of the substrate will refract the laser light to an inside of the substrate. As a result, the laser light is reflected back and forth inside the substrate. In this case, the laser light is easily reflected to the electronic elements of the substrate, which easily causes the electronic elements to be burned, resulting in product defects.

SUMMARY

In an aspect, a substrate is provided. The substrate includes at least two edges; and at least one end portion, each end portion is connected to two adjacent edges. The end portion includes a cutting section and two breaking sections; an end of the cutting section is connected to one of the two adjacent edges through a breaking section, and another end of the cutting section is connected to another one of the two adjacent edges through another breaking section. The cutting section is configured to be formed through cutting of a tool, and the breaking sections are configured to be formed under an action of a physical force.

In some embodiments, an orthographic projection of the cutting section on a plane where the substrate is located includes a first circular arc. An arc center of the first circular arc is located at an inside of the substrate.

In some embodiments, the orthographic projection of the cutting section on the plane where the substrate is located further includes at least one of a second circular arc and a third circular arc. A first end of the second circular arc is connected to an orthographic projection of a breaking section of the two breaking sections on the plane where the substrate is located, a second end of the second circular arc is directly or indirectly connected to a first end of the first circular arc, and an arc center of the second circular arc is located at an outside of the substrate. A first end of the third circular arc is connected to an orthographic projection of another breaking section of the two breaking sections on the plane where the substrate is located, a second end of the third circular arc is directly or indirectly connected to a second end of the first circular arc, and an arc center of the third circular arc is located at an outside of the substrate.

In some embodiments, the at least one of second circular arc and the third circular arc is directly connected to the first circular arc; any one, included in the orthographic projection of the cutting section on the plane where the substrate is located, of the second circular arc and the third circular arc serves as a sixth circular arc, a radius of the sixth circular arc is r21, and r21 satisfies a following formula:

$$r_{21} = k_1 \cdot \sqrt{2} \cdot s \cdot \tan\left[\frac{225° - \arcsin\left(\frac{r_1 \cdot \cos(45° - \alpha/2) - s}{r_1}\right)}{2}\right].$$

$k_1$ is in a range of 1 to 2, inclusive; r1 is a radius of the first circular arc; s is a first limit value; $\alpha$ is a central angle corresponding to an auxiliary circular arc, the auxiliary circular arc is obtained by extending the first circular arc; and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value.

In some embodiments, the at least one of the second circular arc and the third circular arc is indirectly connected to the first circular arc; and the orthographic projection of the cutting section on the plane where the substrate is located further includes at least one of a first straight line segment and a second straight line segment; a first end of the first straight line segment being connected to the second end of the second circular arc, and a second end of the first straight line segment being connected to the first end of the first circular arc; and a first end of the second straight line segment being connected to the second end of the third circular arc, and a second end of the second straight line segment being connected to the second end of the first circular arc.

In some embodiments, the orthographic projection of the cutting section on the plane where the substrate is located includes the second circular arc and the first straight line segment, the first straight line segment is tangent to both the second circular arc and the first circular arc; or the orthographic projection of the cutting section on the plane where the substrate is located includes the third circular arc and the second straight line segment, the second straight line segment is tangent to both the third circular arc and the first circular arc; or the orthographic projection of the cutting section on the plane where the substrate is located includes the second circular arc, the third circular arc, the first straight line segment and the second straight line segment, the first straight line segment is tangent to both the second circular arc and the first circular arc, and the second straight line segment is tangent to both the third circular arc and the first circular arc.

In some embodiments, any one, included in the orthographic projection of the cutting section on the plane where the substrate is located, of the second circular arc and the third circular arc serves as a sixth circular arc, a radius of the sixth circular arc is r22, and r22 satisfies a following formula:

$$r_{22} = k_1 \cdot \sqrt{2} \cdot s \cdot \tan\frac{1}{2}\left(135° + \arctan\frac{u}{\sqrt{r_1^2 - [r_1 \cdot \cos(45° - \alpha/2) - s - u]^2} - \sqrt{r_1^2 - [r_1 \cdot \cos(45° - \alpha/2) - s]^2}}\right)$$

$k_1$ is in a range of 1 to 2, inclusive; r1 is a radius of the first circular arc; s is a first limit value; α is a central angle corresponding to an auxiliary circular arc, the auxiliary circular arc is obtained by extending the first circular arc; and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value; and u is a third limit value.

In some embodiments, the at least one of the second circular arc and the third circular arc is indirectly connected to the first circular arc; and the orthographic projection of the cutting section on the plane where the substrate is located further includes at least one of a fourth circular arc and a fifth circular arc; a first end of the fourth circular arc being connected to the second end of the second circular arc, and a second end of the fourth circular arc being connected to the first end of the first circular arc; and a first end of the fifth circular arc being connected to the second end of the third circular arc, and a second end of the fifth circular arc being connected to the second end of the first circular arc.

In some embodiments, the orthographic projection of the cutting section on the plane where the substrate is located includes the second circular arc and the fourth circular arc, the fourth circular arc is internally tangent to the first circular arc, and the fourth circular arc is externally tangent to the second circular arc; or the orthographic projection of the cutting section on the plane where the substrate is located includes the third circular arc and the fifth circular arc, the fifth circular arc is internally tangent to the first circular arc, and the fifth circular arc is externally tangent to the third circular arc; or the orthographic projection of the cutting section on the plane where the substrate is located includes the second circular arc, the third circular arc, the fourth circular arc and the fifth circular arc; the fourth circular arc is internally tangent to the first circular arc, and the fourth circular arc is externally tangent to the second circular arc; the fifth circular arc is internally tangent to the first circular arc, and the fifth circular arc is externally tangent to the third circular arc.

In some embodiments, the at least one of the second circular arc and the third circular arc is indirectly connected to the first circular arc; and the orthographic projection of the cutting section on the plane where the substrate is located further includes at least one of a group consisting of a first straight line segment and a fourth circular arc and another group consisting of a second straight line segment and a fifth circular arc; a first end of the first straight line segment being connected to the second end of the second circular arc, a second end of the first straight line segment being connected to a first end of the fourth circular arc, and a second end of the fourth circular arc being connected to the first end of the first circular arc; and a first end of the second straight line segment being connected to the second end of the third circular arc, and a second end of the second straight line segment being connected to a first end of the fifth circular arc, a second end of the fifth circular arc being connected to the second end of the first circular arc.

In some embodiments, the orthographic projection of the cutting section on the plane where the substrate is located includes the second circular arc, the fourth circular arc and the first straight line segment; the first straight line segment is tangent to both the second circular arc and the fourth circular arc, and the fourth circular arc is internally tangent to the first circular arc; or the orthographic projection of the cutting section on the plane where the substrate is located includes the third circular arc, the fifth circular arc and the second straight line segment; the second straight line segment is tangent to both the third circular arc and the fifth circular arc, and the fifth circular arc is internally tangent to the first circular arc; or the orthographic projection of the cutting section on the plane where the substrate is located includes the second circular arc, the third circular arc, the fourth circular arc, the fifth circular arc, the first straight line segment and the second straight line segment; the first straight line segment is tangent to both the second circular arc and the fourth circular arc, and the fourth circular arc is internally tangent to the first circular arc; and the second straight line segment is tangent to both the third circular arc and the fifth circular arc, and the fifth circular arc is internally tangent to the first circular arc.

In some embodiments, any one, included in the orthographic projection of the cutting section on the plane where the substrate is located, of the second circular arc and the third circular arc serves as a sixth circular arc, a radius of the sixth circular arc is r23, and r23 satisfies a following formula:

$$r_{23} = k_1 \cdot n \cdot \tan\left\{\frac{270° - \arccos\left[\frac{(r_1 - s)^2 + n^2 - r_1^2}{2n \cdot (r_1 - s)}\right]}{2}\right\}.$$

$k_1$ is in a range of 1 to 2, inclusive; n is a minimum value of L in the formula $$\cos\left(90° - \frac{\alpha}{2}\right) = \frac{r_1^2 + L^2 - (r_1 - s)^2}{2L \cdot r_1};$$

α is a central angle corresponding to an auxiliary circular arc, the auxiliary circular arc is obtained by extending the first circular arc; a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value; r1 is a radius of the first circular arc, and s is a first limit value.

In some embodiments, any one, included in the orthographic projection of the cutting section on the plane where the substrate is located, of the fourth circular arc and the fifth circular arc serves as a seventh circular arc, a radius of the seventh circular arc is $r_4$, and $r_4 = k_2 \cdot r_1$, $k_2$ is in a range of 0.5 to 0.8, inclusive; and $r_1$ is a radius of the first circular arc.

In some embodiments, a shortest distance between each point on a portion of the orthographic projection, on the plane where the substrate is located, of the cutting section except the first circular arc and a circle where the first circular arc is located is less than or equal to a first limit value.

In some embodiments, a dimension of a breaking section of the two breaking sections in a first direction is a second limit value, the first direction being a direction parallel to the plane where the substrate is located and perpendicular to an edge of the two adjacent edges that is connected to the breaking section; and a dimension of another breaking section of the two breaking sections in a second direction is the second limit value, and the second direction is a direction parallel to the plane where the substrate is located and perpendicular to another edge of the two adjacent edges that is connected to the another breaking section.

In another aspect, an electronic device is provided. The electronic device includes at least one substrate as described in any one of the above embodiments.

In some embodiments, the electronic device is a display panel, the display panel further includes at least one metal wire disposed in the display panel and located at a periphery of the display panel. An orthographic projection of the cutting section of the substrate on the plane where the substrate is located includes a first circular arc and a second circular arc, a shortest distance between the first circular arc and a metal wire is greater than a shortest distance between the second circular arc and the metal wire; and/or an orthographic projection of the cutting section of the substrate on the plane where the substrate is located includes a first circular arc and a third circular arc, a shortest distance between the first circular arc and a metal wire is greater than a shortest distance between the third arc and the metal wire; and/or an orthographic projection of the cutting section of the substrate on the plane where the substrate is located includes a first circular arc and a first straight line segment, a shortest distance between the first circular arc and a metal wire is greater than a shortest distance between the first straight line segment and the metal wire; and/or an orthographic projection of the cutting section of the substrate on the plane where the substrate is located includes a first circular arc and a second straight line segment, a shortest distance between the first circular arc and a metal wire is greater than a shortest distance between the second straight line segment and the metal wire; and/or an orthographic projection of the cutting section of the substrate on the plane where the substrate is located includes a first circular arc and a fourth circular arc, a shortest distance between the first circular arc and a metal wire is greater than a shortest distance between the fourth arc and the metal wire; and/or an orthographic projection of the cutting section of the substrate on the plane where the substrate is located includes a first circular arc and a fifth circular arc, a shortest distance between the first circular arc and a metal wire is greater than a shortest distance between the fifth arc and the metal wire.

In yet another aspect, an electronic apparatus is provided. The electronic apparatus includes the electronic device as described in any one of the above embodiments.

In yet another aspect, a method for cutting a substrate is provided. The method includes: cutting a substrate motherboard into a plurality of substrates whose corners are to be removed along at least one first cutting path; determining at least one second cutting path on a substrate whose at least one corner is to be removed, a second cutting path corresponding to the cutting section of the substrate as described in any one of the above embodiments; and cutting the substrate whose at least one corner is to be removed along the each second cutting path, and then removing each corner to be removed by physical force, so as to obtain the substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Figure 1:
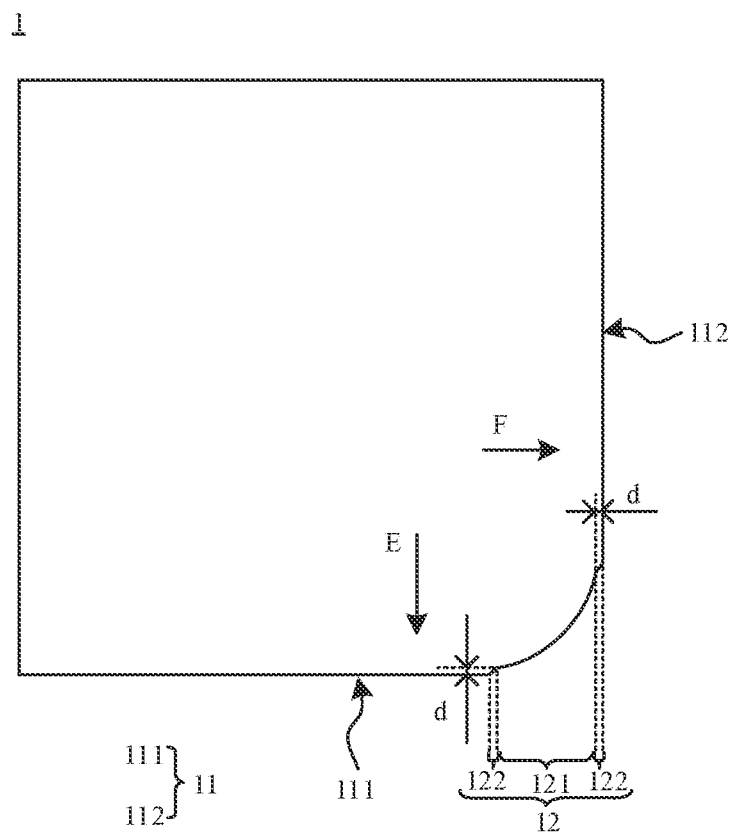
FIG. 1 is a structural diagram of a substrate, in accordance with some embodiments.

Some embodiments of the present disclosure provide a substrate 1. As shown in FIG. 1, the substrate 1 includes at least two edges 11 and at least one end portion 12, and each end portion 12 is connected to two adjacent edges 11. It will be noted that, FIG. 1 only schematically illustrates one end portion 12 of the substrate 1, and does not limit the number of end portions 12 of the substrate 1. That is, in practical applications, the substrate 1 may be provided with only one end portion 12, or two or more end portions 12. Furthermore, in a case where the substrate 1 is provided with two or more end portions 12, each end portion 12 is connected to two edges 11 adjacent thereto. For example, in a case where the substrate 1 includes four edges, and an end portion is provided between any two adjacent edges, the number of the end portions of the substrate 1 should be four.

As shown in FIG. 1, each end portion 12 includes a cutting section 121 and two breaking section 122. An end of the cutting section 121 is connected to one of the two adjacent edges 11 through a breaking section 122, another end of the cutting section 121 is connected to another edge 11 of the two adjacent edges 11 through another breaking section 122.

The cutting section 121 is configured to be formed through cutting of a tool. For example, the tool may be a tool with a cutting function such as a laser cutting machine. The cutting section 121 of the substrate 1 may be formed through cutting using laser light of the laser cutting machine. The breaking sections 122 are configured to be formed under an action of a physical force. For example, the physical force may be gravity or a pressure exerted by an external object. In a case where the physical force is the gravity, after the cutting section 121 is formed through cutting of the tool, a corner, which is to be removed, of a substrate will naturally be broken under the action of the gravity, and thus the substrate 1 is formed. In a case where the physical force is the pressure exerted by the external object, after the cutting section 121 is formed through cutting of the tool, a corner, which is to be removed, of a substrate will naturally be broken under the action of the pressure exerted by the external object (such as a human hand or a mechanical equipment), and thus the substrate 1 is formed.

In the embodiments, since the end portion 12 of the substrate 1 includes both the cutting section 121 and the two breaking sections 122 located at both ends of the cutting section 121, when the corner, which is to be removed, of the substrate is removed, the laser light will not be directed to edges 11 of the substrate 1. As a result, the laser light will not be refracted to an inside of the substrate 1 through the edges 11 of the substrate 1, and in turn, the laser light will not be reflected back and forth inside the substrate 1, which may prevent the laser light from being reflected to electronic elements of the substrate 1. Therefore, it is beneficial to prevent the electronic elements from being burned, thereby reducing product defects.

Figure 2:
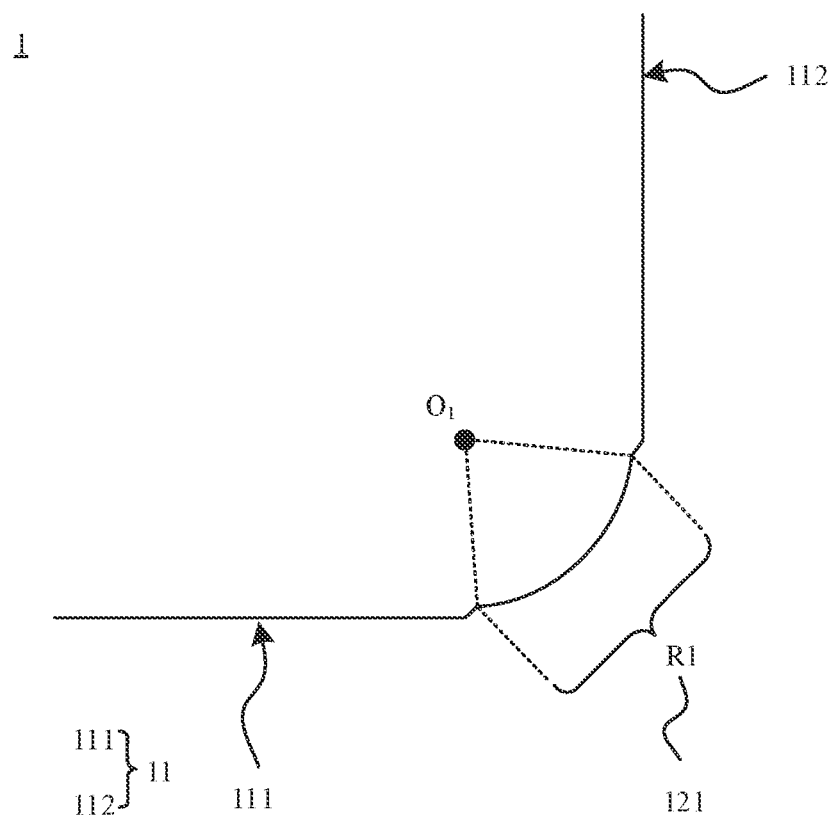
FIG. 2 is a structural diagram of another substrate, in accordance with some embodiments.

In some embodiments, as shown in FIG. 2, an orthographic projection of the cutting section 121 on a plane where the substrate 1 is located includes a first circular arc R1, and an arc center $O_1$ of the first circular arc R1 is located at an inside of the substrate 1. Therefore, a relatively regular rounded corner of the substrate 1 may be formed after a substrate whose corner is to be removed is cut and the corner to be removed of the substrate is broken, which may improve universality of the substrate 1.

It will be noted that, the orthographic projection of the cutting section 121 on the plane where the substrate 1 is located may include only the first circular arc R1; or besides the first circular arc R1, the orthographic projection of the cutting section 121 on the plane where the substrate 1 is located may further include other portion(s) (e.g., as shown in FIGS. 3A, 3B, 4A, 4B and FIGS. 5 to 7, including at least one of a second circular arc R2, a third circular arc R3, a fourth circular arc R4, a fifth circular arc R5, a first straight line segment L1 and a second straight line segment L2).

Figure 3A:
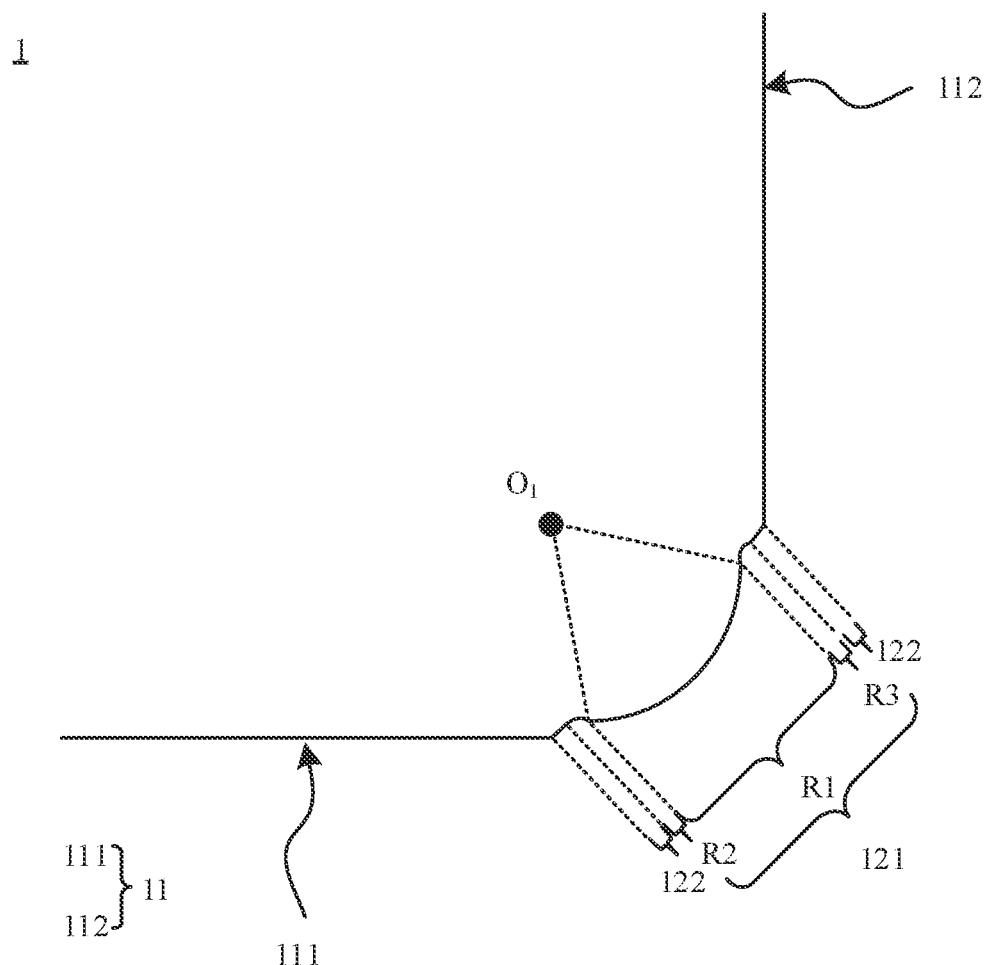
FIGS. 3A and 3B are structural diagrams of yet another substrate, in accordance with some embodiments.
Figure 3B:
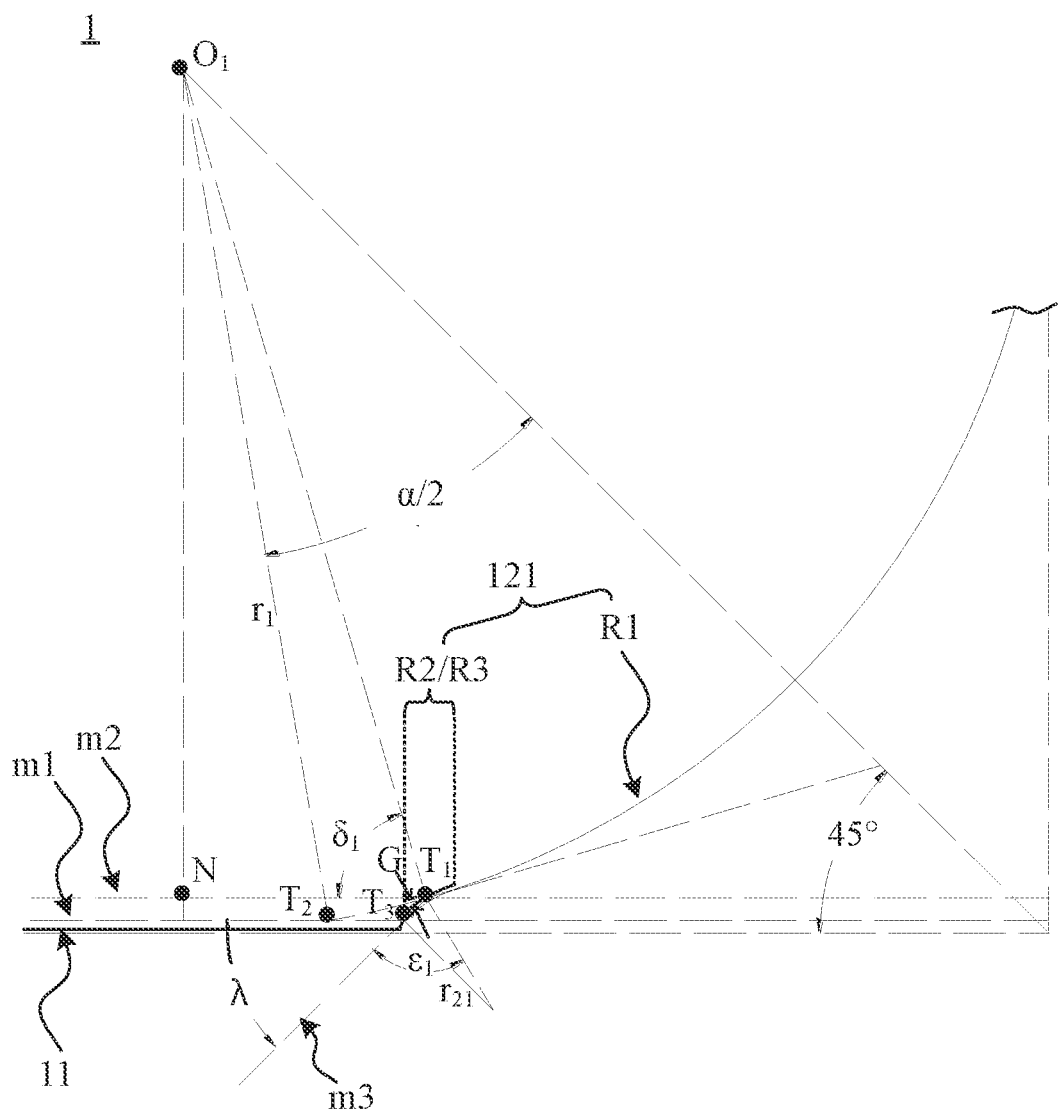

In a case where the orthographic projection of the cutting section 121 on the plane where the substrate 1 is located further includes other portion(s), referring to FIG. 3B, a shortest distance G between each point on the other portion (s) and a circle where the first circular arc R1 is located is less than or equal to a first limit value. The first limit value may be related to a cutting accuracy of the substrate required by a product. For example, in a case where the cutting accuracy required by the product does not exceed h (that is, a cutting offset of the cutting section 121 does not exceed h), the first limit value may be set to be less than or equal to h. In addition, considering a positioning error of the cutting tool, the first limit value may be set to be approximately equal to 0.8 h. For example, in a case where h is equal to 0.05 mm, the first limit value is approximately equal to 0.04 mm. Here, the expression "approximately equal to" refers to being within a range of plus or minus ten percent. That is, in the case where h is equal to 0.05 mm, the first limit value may be in a range of 0.036 mm to 0.044 mm, inclusive. In this case, it is easier to obtain the cutting section 121 that meets the cutting accuracy, and is beneficial to ameliorate a problem that the cutting section 121 is cut more or less.

In some embodiments, as shown in FIG. 1, a dimension of a breaking section 122 of the two breaking sections 122 in a first direction is a second limit value d. The first direction is a direction E parallel to the plane where the substrate 1 is located and perpendicular to an edge 111 of the two adjacent edges 11 that is connected to the breaking section 122. A dimension of another breaking section 122 of the two breaking sections 122 in a second direction is the second limit value d, and the second direction is a direction F parallel to the plane where the substrate 1 is located and perpendicular to another edge 112 of the two adjacent edges 11 that is connected to the another breaking section 122. For a magnitude of the second limit value d, as long as it can satisfy that the breaking sections 122 may be formed under the action of the physical force after the cutting section 121 is formed through cutting.

For example, the second limit value d is in a range of 0.06 mm to 0.1 mm, inclusive. For example, the second limit value d may be in a range of 0.06 mm to 0.08 mm. In other words, a width of the breaking section 122 connected to the edge 111 in the first direction E may be 0.06 mm, 0.07 mm or 0.1 mm, etc. A width of the another breaking section 122 connected to the edge 112 in the second direction F may be 0.06 mm, 0.07 mm or 0.1 mm, etc. With such a design, after the cutting section 121 is formed by cutting the substrate whose corner is to be removed, the corner to be removed of the substrate is relatively easy to be broken, and undesired residual substances are not easily appeared on the substrate 1 obtained after the corner is broken.

Based on this, in order to make the breaking section 122 be broken along a predetermined track, reduce the undesired residual substances generated on the breaking section 122, and reduce burrs on a surface of the breaking section 122, some embodiments of the present disclosure further modify the cutting section 121 of the substrate 1. For example, the cutting section 121 of the substrate 1 includes, but is not limited to, a cutting section 121 in the following embodiments.

In some embodiments, as shown in FIGS. 3A, 4A, 5 and 6, besides the first circular arc R1, the orthographic projection of the cutting section 121 on the plane where the substrate 1 is located further includes a second circular arc R2 and/or a third circular arc R3.

Figure 4A:
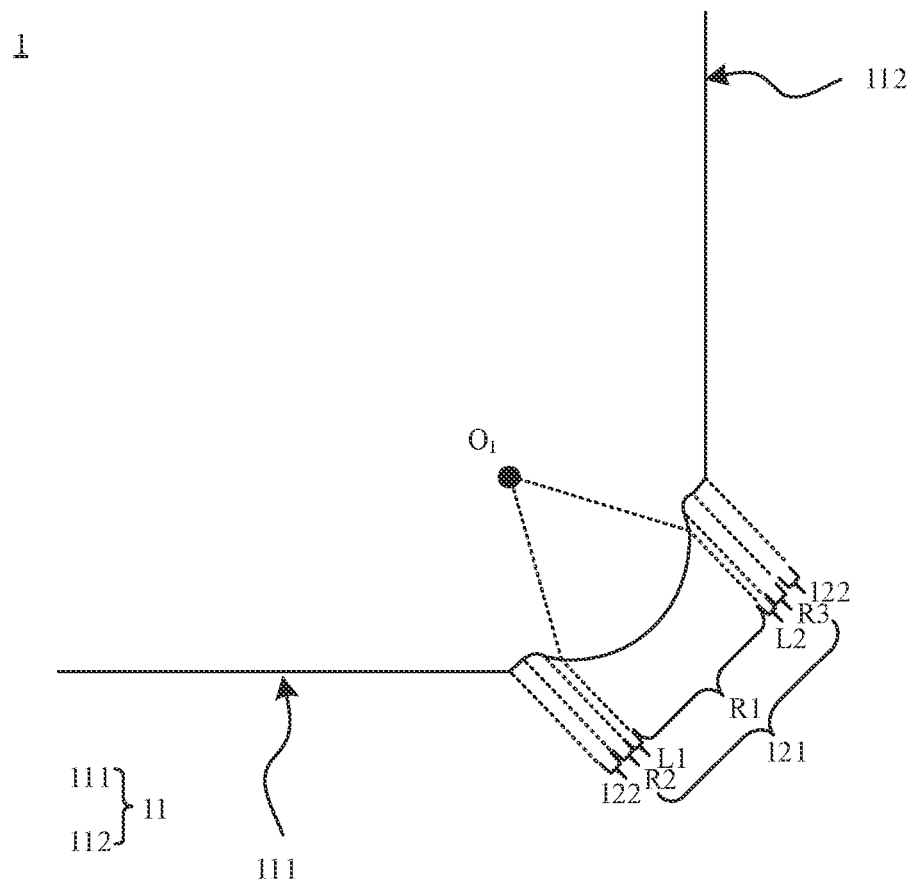
FIGS. 4A and 4B are structural diagrams of yet another substrate, in accordance with some embodiments.
Figure 5:
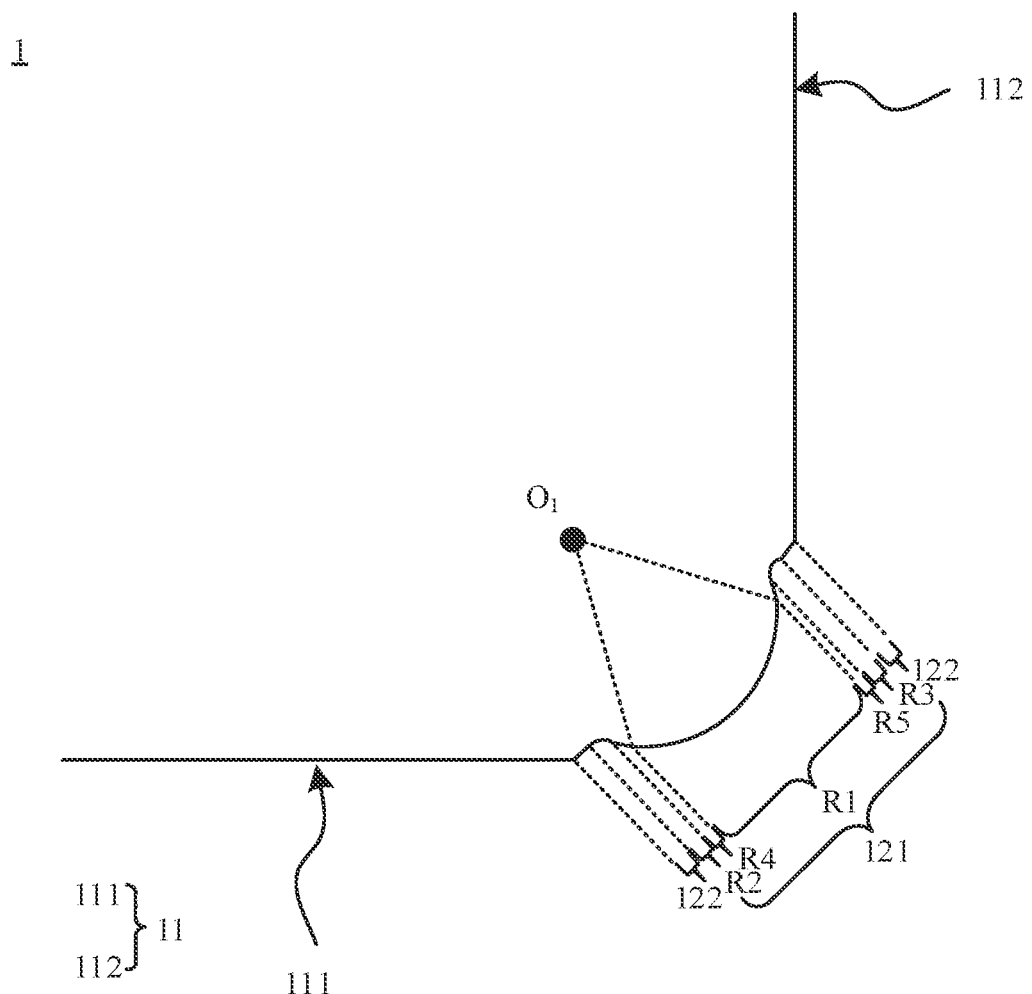
FIG. 5 is a structural diagram of yet another substrate, in accordance with some embodiments.
Figure 6:
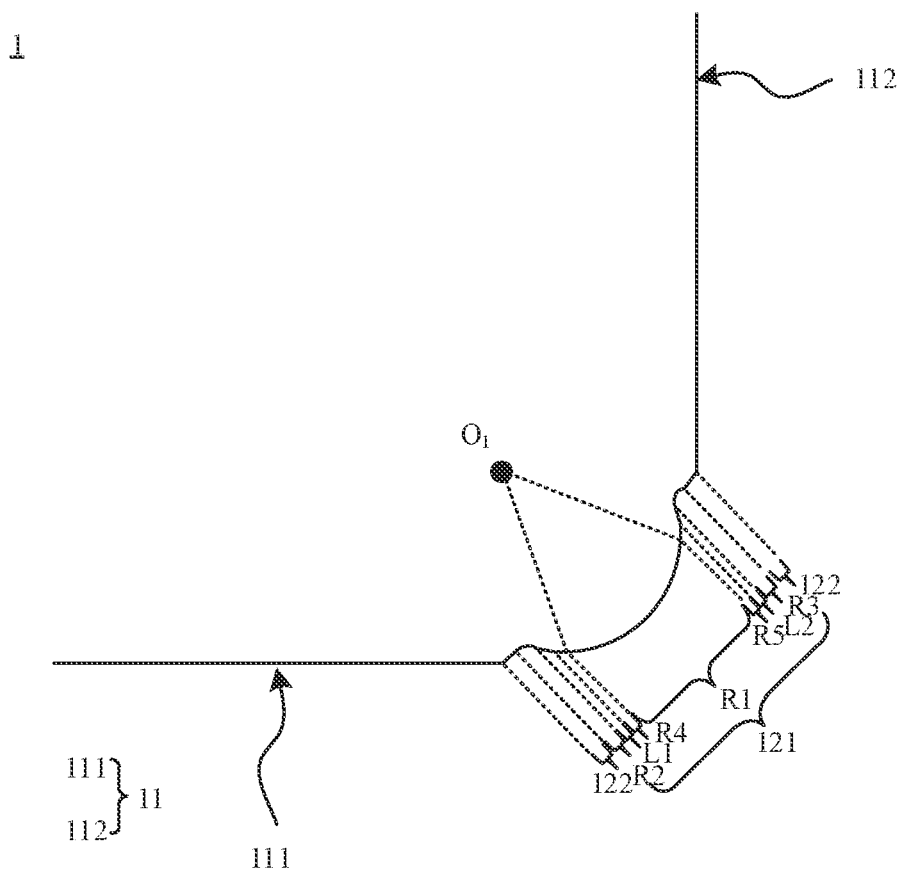
FIG. 6 is a structural diagram of yet another substrate, in accordance with some embodiments.

A first end of the second circular arc R2 is connected to an orthographic projection of a breaking section 122 (i.e., one of the two breaking sections 122 included in the end portion 12 corresponding to the second circular arc R2) on the plane where the substrate 1 is located, and a second end of the second circular arc R2 is directly or indirectly connected to a first end of the first circular arc R1 (e.g., FIG. 3A shows a case where the second end of the second circular arc R2 is directly connected to the first end of the first circular arc R1, and FIGS. 4A, 5 and 6 show a case where the second end of the second circular arc R2 is indirectly connected to the first end of the first circular arc R1). An arc center of the second circular arc R2 is located at an outside of the substrate 1. With such a design, stress generated when the corner to be removed of the substrate is broken is uniformly distributed, and a phenomenon of stress concentration is less likely to occur. As a result, the corner may be better broken along the predetermined track, so that the breaking section 122 of the substrate 1 is less likely to have residues and burrs thereon.

A first end of the third circular arc R3 is connected to an orthographic projection of another breaking section 122 (i.e., the other of the two breaking sections 122 included in the end portion 12 corresponding to the second circular arc R2) on the plane where the substrate 1 is located, and a second end of the third circular arc R3 is directly or indirectly connected to a second end of the first circular arc R1 (e.g., FIG. 3A shows a case where the second end of the third circular arc R3 is directly connected to the second end of the first circular arc R1, and FIGS. 4A, 5 and 6 show a case where the second end of the third circular arc R3 is indirectly connected to the second end of the first circular arc R1). An arc center of the third circular arc R3 is located at the outside of the substrate 1. With such a design, the stress generated when the corner to be removed of the substrate is broken is uniformly distributed, and the phenomenon of stress concentration is less likely to occur. Therefore, the corner may be better broken along the predetermined track, so that the breaking section 122 of the substrate 1 is less likely to have residues and burrs thereon.

In some embodiments, any one, included in the orthographic projection of the cutting section 121 on the plane where the substrate 1 is located, of the second circular arc R2 and the third circular arc R3 serves as a sixth circular arc, and the sixth circular arc is directly connected to the first circular arc R1. That is, in a case where the orthographic projection of the cutting section 121 includes the second circular arc R2, the second end of the second circular arc R2 is directly connected to the first end of the first circular arc R1; and/or in a case where the orthographic projection of the cutting section 121 includes the third circular arc R2, the second end of the third circular arc R3 is directly connected to the second end of the first circular arc R1.

For anyone of the second circular arc R2 and the third circular arc R3, in a design process, a position of the arc center $O_1$ of the first circular arc R1 and a radius $r_1$ of the first circular arc R1 are known. Referring to FIG. 3B, a first auxiliary line m1 and a second auxiliary line m2 are firstly drawn on a side of an orthographic projection, on the plane where the substrate 1 is located, of any one edge 11 that is connected to the end portion 12 close to the first circular arc R1. The first auxiliary line m1 is parallel to the orthographic projection of the edge 11 on the plane where the substrate 1 is located, and a distance between the first auxiliary line m1 and the orthographic projection of the edge 11 on the plane where the substrate 1 is located is the second limit value (e.g., the second limit value may be in the range of 0.06 mm to 0.1 mm, inclusive); the second auxiliary line m2 is parallel to the orthographic projection of the edge 11 on the plane where the substrate 1 is located, and a distance between the second auxiliary line m2 and the orthographic projection of the edge 11 on the plane where the substrate 1 is located is a sum of the second limit value and the first limit value (e.g., the first limit value may be in the range of 0.036 mm to 0.044 mm, inclusive).

Then, an intersection point is determined as a first position point $T_1$, the intersection point being an intersection point closest to the first circular arc R1 in all intersection points of the circle where the first circular arc R1 is located and the second auxiliary line m2; and an intersection point is determined as a second position point $T_2$, the intersection point being an intersection point closest to the first circular arc R1 in all intersection points of the circle where the first circular arc R1 is located and the first auxiliary line m1.

Next, a third auxiliary line m3 passing through the first position point $T_1$ is drawn, and an angle between the third auxiliary line m3 and the first auxiliary line m1 is a preset angle λ; the third auxiliary line m3 and the first auxiliary line m1 intersect at a third position point $T_3$. A value of the preset angle λ is not limited in the embodiments, as long as it is ensured that the third position point $T_3$ is between the first position point $T_1$ and the second position point $T_2$ in a direction parallel to the first auxiliary line m1. For example, the preset angle λ may be in a range of 30° to 60°, inclusive.

Finally, a circular arc passing through the third position point $T_3$ and tangent to both the third auxiliary line m3 and the first circular arc R1 is drawn, and the circular arc is the second circular arc R2 or the third circular arc R3.

Based on this, for example, a radius of the second circular arc is $r_{21}$, and/or a radius of the third circular arc is $r_{21}$. That is, a radius of the sixth circular arc is $r_{21}$. $r_{21}$ satisfies the following formula:

$$r_{21} = k_1 \cdot \sqrt{2} \cdot s \cdot \tan\left[\frac{225° - \arcsin\left(\frac{r_1 \cdot \cos(45° - \alpha/2) - s}{r_1}\right)}{2}\right].$$

$k_1$ is in a range of 1 to 2, inclusive: $r_1$ is the radius of the first circular arc; s is the first limit value; α is a central angle corresponding to an auxiliary circular arc, the auxiliary circular arc is obtained by extending the first circular arc, and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to the second limit value. The first limit value and the second limit value have been described above, and will not be repeated here.

Referring to FIG. 3B, in an example where the preset angle λ is equal to 45°. According to a geometric relationship, the radius $r_{21}$ of the second circular arc R2 or the third circular arc R3 is equal to a length of a line segment $T_1T_3$ (i.e., a line segment between the first position point $T_1$ and the third position point $T_3$) multiplied by tan $\varepsilon_1$. A length of the line segment $T_1T_3$ is equal to $\sqrt{2} \cdot s$, where s is the first limit value.

In addition, according to a geometric relationship, it may be known that a length of a line segment $O_1N$ (i.e., a distance between the arc center $O_1$ of the first circular arc R1 and the second auxiliary line m2) is $r_1 \cdot \cos(45° - \alpha/2) - s$;

$$\delta_1 = \arcsin\left(\frac{r_1 \cdot \cos(45° - \alpha/2) - s}{r_1}\right).$$

In addition, based on FIG. 3B, it may be known that a tangent line passing through the first position point $T_1$ and tangent to a circular arc to be determined (i.e., the second circular arc R2 or the third circular arc R3) almost coincides with a tangent line passing through the first position point $T_1$ and tangent to the first circular arc R1. Therefor, $$\varepsilon_1 \approx \frac{360° - 90° - 45° - \delta_1}{2}.$$

As a result, it is obtained that:

$$r_{21} = \sqrt{2} \cdot s \cdot \tan\left[\frac{225° - \arcsin\left(\frac{r_1 \cdot \cos(45° - \alpha/2) - s}{r_1}\right)}{2}\right].$$

It will be noted that the above derivation process is illustrated by considering an example in which the preset angle $\lambda$ is equal to 45°. In the embodiments, $$r_{21} = k_1 \cdot \sqrt{2} \cdot s \cdot \tan\left[\frac{225° - \arcsin\left(\frac{r_1 \cdot \cos(45° - \alpha/2) - s}{r_1}\right)}{2}\right],$$

and $k_1$ is designed in the range of 1 to 2, inclusive. In this way, various second circular arcs R2 or third circular arcs R3 that meet requirements may be obtained.

Based on this, according to the obtained $\varepsilon_1$, it may also be possible to calculate a central angle of the second circular arc R2 or the third circular arc R3. That is, the central angle of the second circular arc R2 or the third circular arc R3 is equal to $(2 \times (90° - \varepsilon_2))$.

In the embodiments, the central angle of the second circular arc R2 may be in a range of 25° to 40°, inclusive; and the central angle of the third circular arc R3 may also be in the range of 25° to 40°, inclusive.

In some embodiments, any one, included in the orthographic projection of the cutting section 121 on the plane where the substrate 1 is located, of the second circular arc R2 and the third circular arc R3 serves as a sixth circular arc, and the sixth circular arc is directly connected to the first circular arc R1. That is, in a case where the orthographic projection of the cutting section 121 includes the second circular arc R2, the second end of the second circular arc R2 is indirectly connected to the first end of the first circular arc R1; and/or in a case where the orthographic projection of the cutting section 121 includes the third circular arc R2, the second end of the third circular arc R3 is indirectly connected to the second end of the first circular arc R1.

Figure 4B:
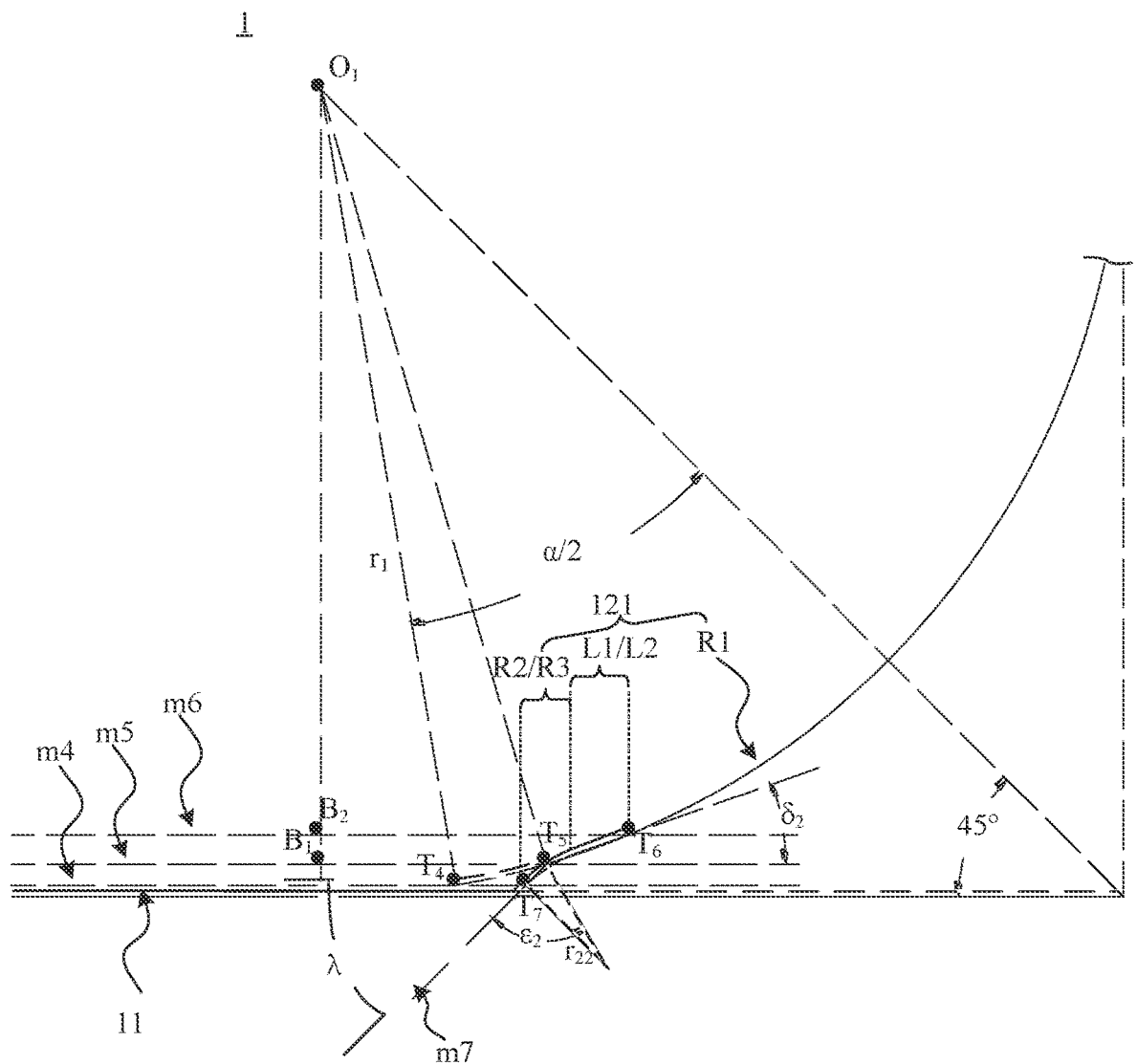

For example, as shown in FIG. 4B, the orthographic projection of the cutting section 121 on the plane where the substrate is located further includes the first straight line segment L1 and/or the second straight line segment L2.

A first end of the first straight segment L1 is connected to the second end of the second circular arc R2, and a second end of the first straight segment L1 is connected to the first end of the first circular arc R1. With such a design, a smooth transition may be achieved between the first circular arc R1 and the second circular arc R2 through the first straight line segment L1, so that the cutting section 121 is less likely to have sharp corners, which may better meet use requirements of the substrate.

A first end of the second straight line segment L2 is connected to the second end of the third circular arc R3, and a second end of the second straight line segment L2 is connected to the second end of the first circular arc R1. With such a design, a smooth transition may be achieved between the first circular arc R1 and the third circular arc R3 through the second straight line segment L2, so that the cutting section 121 is less likely to have sharp corners, which may better meet use requirements of the substrate.

Based on this, as shown in FIG. 4B, in some examples, the first straight line segment L1 is tangent to both the second circular arc R2 and the first circular arc R1, and/or the second straight line segment L2 is tangent to both the third circular arc R3 and the first circular arc R1. In this way, a smoother transition effect may be achieved between the first circular arc R1 and the second circular arc R2, and/or between the first circular arc R1 and the third circular arc R3.

In a design process, refering to FIG. 4B, the position of the arc center O1 of the first circular arc R1 and the radius $r_1$ of the first circular arc R1 are known. Referring to FIG. 4B, a fourth auxiliary line m4, a fifth auxiliary line m5 and a sixth auxiliary line m6 are firstly drawn on a side of an orthographic projection, on the plane where the substrate 1 is located, of any one edge 11 that is connected to the end portion 12 close to the first circular arc R1. The fourth auxiliary line m4 is parallel to the orthographic projection of the edge 11 on the plane where the substrate 1 is located, and a distance between the fourth auxiliary line m4 and the orthographic projection of the edge 11 on the plane where the substrate 1 is located is the second limit value (e.g., the second limit value may be in the range of 0.06 mm to 0.1 mm, inclusive); the fifth auxiliary line m5 is parallel to the orthographic projection of the edge 11 on the plane where the substrate 1 is located, and a distance between the fifth auxiliary line m5 and the orthographic projection of the edge 11 on the plane where the substrate 1 is located is the sum of the second limit value and the first limit value (e.g., the first limit value may be in the range of 0.036 mm to 0.044 mm, inclusive); the sixth auxiliary line m6 is parallel to the orthographic projection of the edge 11 on the plane where the substrate 1 is located, and a distance between the sixth auxiliary line m6 and the orthographic projection of the edge 11 on the plane where the substrate 1 is located is a sum of the second limit value, the first limit value and a third limit value. For example, the third limit value is approximately equal to 0.05 mm. Here, the term "approximately" means that the third limit value may be plus or minus ten percent on a basis of 0.05 mm. By setting the third limit value in this way, it is beneficial to achieve a smooth transition between the first straight line segment L1 (or the second straight line segment L2) subsequently formed and the circular arc adjacent to the first straight line segment L1 (or the second straight line segment L2).

Then, an intersection point is determined as a fourth position point $T_4$, the intersection point being an intersection point closest to the first circular arc R1 in all intersection points of the circle where the first circular arc R1 is located and the fourth auxiliary line m4; an intersection point is determined as a fifth position point $T_5$, the intersection point being an intersection point closest to the first circular arc R1 in all intersection points of the circle where the first circular arc R1 is located and the fifth auxiliary line m5; and an intersection point is determined as a sixth position point $T_6$, the intersection point being an intersection point closest to the first circular arc R1 in all intersection points of the circle where the first circular arc R1 is located and the sixth auxiliary line m6.

Next, a seventh auxiliary line m7 passing through the fifth position point $T_5$ is drawn, and an angle between the seventh auxiliary line m7 and the fourth auxiliary line m4 is a preset angle λ; the seventh auxiliary line m7 and the fourth auxiliary line m4 intersect at a seventh position point $T_7$. A value of the preset angle λ is not limited in the embodiments, as long as it is ensured that the seventh position point $T_7$ is between the fourth position point $T_4$ and the fifth position point $T_5$ in a direction parallel to the fourth auxiliary line m4. For example, the preset angle λ may be in a range of 30° to 60°, inclusive.

Finally, a circular arc (i.e., the second circular arc R2 or the third circular arc R3) passing through the seventh point $T_7$ and tangent to both the seventh auxiliary line m7 and a line segment $T_5T_6$ (i.e., a line segment between the fifth position point $T_5$ and the sixth position point $T_6$) is drawn. A portion of the line segment $T_5T_6$ between the drawn circular arc (i.e. the second circular arc R2 or the third circular arc R3) and the first circular arc R1 is the first straight line segment L1 or the second straight line segment L2.

Based on this, for example, a radius of the second circular arc R2 is $r_{22}$, and/or a radius of the third circular arc R3 is $r_{22}$. That is, a radius of the sixth circular arc is $r_{22}$. $r_{22}$ satisfies the following formula:

$$r_{22} = k_1 \cdot \sqrt{2} \cdot s \cdot \tan\frac{1}{2}\left(135° + \arctan\frac{u}{\sqrt{r_1^2 - [r_1 \cdot \cos(45° - \alpha/2) - s - u]^2} - \sqrt{r_1^2 - [r_1 \cdot \cos(45° - \alpha/2) - s]^2}}\right)$$

$k_1$ is in the range of 1 to 2, inclusive; $r_1$ is the radius of the first circular arc; s is the first limit value; α is a central angle corresponding to an auxiliary circular arc, the auxiliary circular arc is obtained by extending the first circular arc R1, and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to the second limit value; and u is the third limit value. The first limit value, the second limit value and the third limit value have been described above, and will not be repeated here.

Referring to FIG. 4B, in an example where the preset angle λ is equal to 45°. According to a geometric relationship, the radius $r_{22}$ of the second circular arc is equal to a length of a line segment $T_5T_7$ (i.e., a line segment between the fifth position point $T_5$ and the seventh position point $T_7$) multiplied by tan $\varepsilon_2$, and/or the radius $r_{22}$ of the third circular arc is equal to the length of the line segment $T_5T_7$ multiplied by tan $\varepsilon_2$. The length of the line segment $T_5T_7$ is equal to $\sqrt{2} \cdot s$, s being the first limit value as described above.

In addition, according to a geometric relationship, it may be known that a length of a line segment $O_1B_1$ (i.e., a line segment between the arc center $O_1$ of the first circular arc R1 and an intersection point $B_1$) is $r_1 \cdot \cos(45° - \alpha/2) - s$, and a length of a line segment $O_1B_2$ (i.e., a line segment between the arc center $O_1$ of the first circular arc R1 and an intersection point $B_2$) is $r_1 \cdot \cos(45° - \alpha/2) - s - u$. The intersection point $B_1$ is an intersection point of the fifth auxiliary line m5 and a line passing through the arc center $O_1$ of the first circular arc R1 and perpendicular to the fifth auxiliary line m5. The intersection point $B_2$ is an intersection point of the sixth auxiliary line m6 and the line.

Based on this, according to the Pythagorean theorem, it may be known that:

a length of a line segment $T_5B_1$ (i.e., a line segment between the fifth position point $T_5$ and the intersection point $B_1$) is $\sqrt{r_1^2 - [r_1 \cdot \cos(45° - \alpha/2) - s]^2}$, and a length of a line segment $T_6B_2$ (i.e., a line segment between the sixth position point $T_6$ and the intersection point $B_2$) is $\sqrt{r_1^2 - [r_1 \cdot \cos(45° - \alpha/2) - s - u]^2}$. Further, it may be known that:

$$\delta_2 = \arctan\frac{u}{\sqrt{r_1^2 - [r_1 \cdot \cos(45° - \alpha/2) - s - u]^2} - \sqrt{r_1^2 - [r_1 \cdot \cos(45° - \alpha/2) - s]^2}}.$$

Since $$\varepsilon_2 = \frac{135° + \delta_2}{2},$$

$$r_{22} = \sqrt{2} \cdot s \cdot \tan\left[\frac{135° + \delta_2}{2}\right].$$

As a result, it is obtained that: $r_{22} = \sqrt{2} \cdot s \cdot \tan \frac{1}{2}(135° + \arctan u/\sqrt{r_1^2 - [r_1 \cdot \cos(45° - \alpha/2) - s - u]^2} - \sqrt{r_1^2 - [r_1 \cdot \cos(45° - \alpha/2) - s]^2})$.

It will be noted that the above derivation process is illustrated by considering an example in which the reset angle λ is equal to 45°. In the embodiments $$r_{22} = k_1 \cdot \sqrt{2} \cdot s \cdot \tan\frac{1}{2}\left(135° + \arctan\frac{u}{\sqrt{r_1^2 - [r_1 \cdot \cos(45° - \alpha/2) - s - u]^2} - \sqrt{r_1^2 - [r_1 \cdot \cos(45° - \alpha/2) - s]^2}}\right),$$

and $k_1$ is designed in the range of 1 to 2, inclusive. In this way, various second circular arcs R2 or third circular arcs R3 that meet requirements may be obtained.

Based on this, according to the obtained $\varepsilon_2$, it may also be possible to calculate a central angle of the second circular arc R2 or the third circular arc R3. That is, the central angle of the second circular arc R2 or the third circular arc R3 is equal to $(2 \times (90° - \varepsilon_2))$.

In the embodiments, the central angle of the second circular arc R2 may be in a range of 30° to 40°, inclusive;

and the central angle of the third circular arc R3 may also be in the range of 30° to 40°, inclusive.

In the case where any one, included in the orthographic projection of the cutting section 121 on the plane where the substrate 1 is located, of the second circular arc R2 and the third circular arc R3 serves as the sixth circular arc, and the sixth circular arc is directly connected to the first circular arc R1 (that is, in the case where the second end of the second circular arc R2 is indirectly connected to the first end of the first circular arc R1, and/or the second end of the third circular arc R3 is indirectly connected to the second end of the first circular arc R1), in another example, as shown in FIG. 5, the orthographic projection of the cutting section 121 on the plane where the substrate is located further includes the fourth circular arc R4 and/or the fifth circular arc R5.

A first end of the fourth circular arc R4 is connected to the second end of the second circular arc R2, and a second end of the fourth circular arc R4 is connected to the first end of the first circular arc R1. With such a design, a smooth transition may be achieved between the first circular arc R1 and the second circular arc R2 through the fourth circular arc R4, so that the cutting section 121 is less likely to have sharp corners, which may better meet use requirements of the substrate.

A first end of the fifth circular arc R5 is connected to the second end of the third circular arc R3, and a second end of the fifth circular arc R5 is connected to the second end of the first circular arc R1. With such a design, a smooth transition may be achieved between the first circular arc R1 and the third circular arc R3 through the fifth circular arc R5, so that the cutting section 121 is less likely to have sharp corners, which may better meet the use requirements of the substrate.

In the case where any one, included in the orthographic projection of the cutting section 121 on the plane where the substrate 1 is located, of the second circular arc R2 and the third circular arc R3 serves as the sixth circular arc, and the sixth circular arc is directly connected to the first circular arc R1 (that is, in the case where the second end of the second circular arc R2 is indirectly connected to the first end of the first circular arc R1, and/or the second end of the third circular arc R3 is indirectly connected to the second end of the first circular arc R), in yet another example, as shown in FIG. 6, the orthographic projection of the cutting section 121 on the plane where the substrate is located further includes at least one of a group consisting of the first straight line segment L1 and the fourth circular arc R4 and another group consisting of the second straight line segment L2 and the fifth circular arc R5 (i.e., the first straight line segment L1 and the fourth circular arc R4; and/or the second straight line segment L2 and the fifth circular arc R5).

As shown in FIG. 6, a first end of the first straight line segment L1 is connected to the second end of the second circular arc R2, a second end of the first straight line segment L1 is connected to a first end of the fourth circular arc R4, and a second end of the fourth circular arc R4 is connected to the first end of the first circular arc R1. With such a design, a smooth transition may be achieved between the first circular arc R1 and the second circular arc R2 through the first straight line segment L1 and the fourth circular arc R4, so that the cutting section 121 is less likely to have sharp corners, which may better meet use requirements of the substrate.

As shown in FIG. 6, a first end of the second straight line segment L2 is connected to the second end of the third circular arc R3, a second end of the second straight line segment L2 is connected to a first end of the fifth circular arc R5, and a second end of the fifth circular arc R5 is connected to the second end of the first circular arc R1. With such a design, a smooth transition may be achieved between the first circular arc R1 and the third circular arc R3 through the second straight line segment L2 and the fifth circular arc R5, so that the cutting section 121 is less likely to have sharp corners, which may better meet use requirements of the substrate.

Based on this, in some examples, as shown in FIG. 6, the first straight line segment L1 is tangent to both the second circular arc R2 and the fourth circular arc R4, and/or the second straight line segment L2 is tangent to both the third circular arc R3 and the fifth circular arc R5. In this way, a smoother transition effect may be achieved between the second circular arc R2 and the fourth circular arc R4, and/or between the third circular arc R3 and the fifth circular arc R5; and thus, the transition effect between the first circular arc R1 and the second circular arc R2, and/or between the first circular arc R1 and the third circular arc R3 may be further enhanced. As a result, a probability of sharp corners occurring to the cutting section 121 is greatly reduced.

Figure 7:
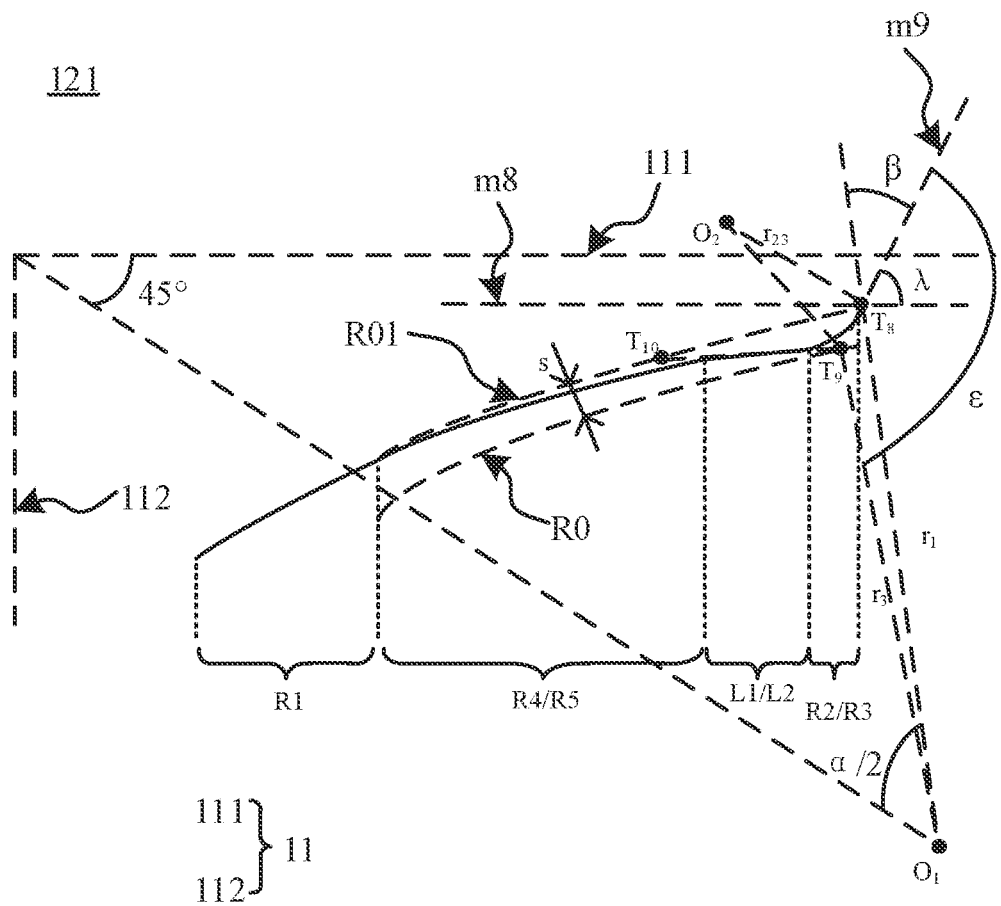
FIG. 7 is a structural diagram of yet another substrate, in accordance with some embodiments.

For solutions shown in FIGS. 5 and 6, in a design process, referring to FIG. 7, an eighth auxiliary line m8 is firstly drawn on a side of an orthographic projection, on the plane where the substrate 1 is located, of any one edge 11 that is connected to the end portion 12 close to the first circular arc R1, and the eighth auxiliary line m8 is parallel to the orthographic projection of the edge 11 on the plane where the substrate 1 is located, and a distance between the eighth auxiliary line m8 and the orthographic projection of the edge 11 on the plane where the substrate 1 is located is the second limit value as described above (e.g., the second limit value may be in the range of 0.06 mm to 0.1 mm).

Then, an intersection point is determined as an eighth position point $T_8$, the intersection point being an intersection point closest to the first circular arc R1 in all intersection points of the circle where the first circular arc R1 is located and the eighth auxiliary line m8.

Next, according to the radius $r_1$ of the first circular arc R1 and the first limit value s, a radius $r_3$ of an offset circular arc R0 is determined. The radius $r_3$ of the offset circular arc R0 is equal to a difference between the radius $r_1$ of the first circular arc R1 and the first limit value s (that is, $r_3 = r_1 - s$). Therefore, a position of the offset circular arc R0 may be determined. The offset circular arc R0 defines an allowable cutting offset of the product. An actual cutting position should not exceed the offset circular arc.

A ninth auxiliary line m9 passing through the eighth position point $T_8$ is drawn, and an angle between the ninth auxiliary line m9 and the eight auxiliary line m8 is a preset angle λ; the ninth auxiliary line m9 and the offset circular arc intersect at a ninth position point $T_9$. A value of the preset angle λ is not limited in the embodiments, as long as it is ensured the ninth point $T_9$ is closer to the first circular arc R1 than the eighth position point $T_8$. For example, the preset angle λ may be in the range of 30° to 60°, inclusive.

A tangent line of the offset arc R0 passing through the ninth position point $T_9$ is drawn, and the tangent line intersects the circle where the first circular arc R1 is located at a tenth position point $T_{10}$.

Finally, a circular arc (i.e., the second circular arc R2 or the third circular arc R3) passing through the eight position point $T_8$ and tangent to both the ninth auxiliary line m9 and a line segment $T_9T_{10}$ (i.e., a line segment between the ninth position point $T_9$ and the tenth position point $T_{10}$) is drawn, an end of the circular arc opposite the eighth position point $T_8$ is located on the line segment $T_9T_{10}$.

Based on this, for a solution shown in FIG. 5, a circular arc (i.e., the fourth circular arc R4 in examples shown in FIG. 5) that is internally tangent to the first circular arc R1 and externally tangent to the second circular arc R2 is drawn between the second circular arc R2 and the first circular arc R1; and a circular arc (i.e., the fifth circular arc R5 in the examples shown in FIG. 5) that is internally tangent to the first circular arc R1 and externally tangent to the third circular arc R3 is drawn between the third circular arc R3 and the first circular arc R1.

For a solution shown in FIG. 6, as shown in FIG. 7, an inverted circular is drawn at the tenth position point $T_{10}$, so as to obtain a circular arc (i.e., the fourth circular arc R4 or the fifth circular arc R5) that is tangent to the line segment $T_9T_{10}$ and internally tangent to the first circular arc R1. In this case, a portion of the line segment $T_9T_{10}$ between the second circular arc R2 and the fourth circular arc R4 is the first straight line segment L1, and a portion of the line segment $T_9T_{10}$ between the third circular arc R3 and the fifth circular arc R5 is the second straight line segment L2.

For the solutions shown in FIGS. 5 and 6, for example, the radius of the second circular arc R2 is $r_{23}$, and/or the radius of the third circular arc R3 is $r_{23}$. That is, a radius of the sixth circular arc is $r_{23}$. $r_{23}$ satisfies the following formula:

$$r_{23} = k_1 \cdot n \cdot \tan\left\{\frac{270° - \arccos\left[\frac{(r_1-s)^2 + n^2 - r_1^2}{2_n \cdot (r_1-s)}\right]}{2}\right\}.$$

$k_1$ is in the range of 1 to 2, inclusive; n is a minimum value of L in the formula $$\cos\left(90° - \frac{\alpha}{2}\right) = \frac{r_1^2 + L^2 - r_3^2}{2r_1 L};$$

$\alpha$ is a central angle corresponding to an auxiliary circular arc (the auxiliary circular arc R01 shown in FIG. 7), the auxiliary circular arc is obtained by extending the first circular arc R1, and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to the second limit value (as shown in FIG. 7, a vertical distance between an end point (i.e., the eighth position point) $T_6$ of the auxiliary circular arc R01 and an orthographic projection, on the plane where the substrate 1 is located, of an edge 11 adjacent to the eighth position point $T_8$ is equal to the second limit value); r1 is the radius of the first circular arc R1, and s is the first limit value. The first limit value and the second limit value have been described above, and will not be repeated here.

In the design process, referring to FIG. 7, the radius of the second circular arc R2 is $r_{23}$, and/or the radius of the third circular arc R3 is $r_{23}$. For example, the preset angle $\lambda$ is equal to 45°. According to a geometric relationship, $r_{23}$ is equal to a length of a line segment $T_8T_9$ (i.e., a line segment between the eighth position point $T_8$ and the ninth position point $T_9$) multiplied by tan $\angle T_8T_9O_2$.

As shown in FIG. 7, $\beta=180°-\lambda-(45°+\alpha/2)$, where $\alpha$ and $\lambda$ are known quantities. Therefore, $\beta=90°-\alpha/2$. That is, $\beta$ is also a known quantity.

The length of the line segment $T_8T_9$ is assumed to be L, and according to the cosine theorem, it will be known that $$\cos\beta = \frac{r_1^2 + L^2 - r_3^2}{2L \cdot r_1}.$$

That is, $$\cos\left(90° - \frac{\alpha}{2}\right) = \frac{r_1^2 + L^2 - r_3^2}{2L \cdot r_1}.$$

Here, referring to FIG. 7, it will be noted that there are two intersection points between the ninth auxiliary line m9 and a circle where the offset circular arc is located. Therefore, two values of L may be calculated according to the above formula, and the length of the line segment $T_8T_9$ is a minimum value n of the two values of L.

Based on this, referring to FIG. 7, according to the cosine theorem, it may be known that, $$\cos\varepsilon = \frac{r_3^2 + n^2 - r_1^2}{2n \cdot r_3}.$$

Since the line segment $T_9T_{10}$ is the tangent of the offset circular arc R0, the line segment $T_9T_{10}$ and a line segment $T_9O_1$ (i.e., a line segment between the ninth position point $T_9$ and an arc center $O_1$ of the offset circular arc R0) are perpendicular to each other. Therefore, $\angle T_8T_9T_{10}=360°-90°-\varepsilon$. That is, $$\angle T_8T_9T_{10} = 270° - \arccos\left(\frac{r_3^2 + n^2 - r_1^2}{2n \cdot r_3}\right).$$

Then, according to the trigonometric function, it may be obtained that, $$r_{23} = n \cdot \tan\left[\frac{270° - \arccos\left[\frac{r_3^2 + n^2 - r_1^2}{2n \cdot r_3}\right]}{2}\right].$$

Moreover, since the radius of the offset circular arc is $r_3 = r_1 - s$, $$r_{23} = n \cdot \tan\left\{\frac{270° - \arccos\left(\frac{(r_1-s)^2 + n^2 - r_1^2}{2n \cdot (r_1-s)}\right)}{2}\right\}.$$

It will be noted that the above derivation process is illustrated by considering an example in which the preset angle $\lambda$ is equal to 45°. In the embodiments, $$r_{23} = k_1 \cdot n \cdot \tan\left\{\frac{270° - \arccos\left[\frac{(r_1-s)^2 + n^2 - r_1^2}{2n \cdot (r_1-s)}\right]}{2}\right\},$$

and $k_1$ is designed in the range of 1 to 2, inclusive. In this way, various second circular arcs R2 or third circular arcs R3 that meet requirements may be obtained.

Based on this, according to the obtained $\angle T_8T_9O_2$, a central angle of the second circular arc R2 or the third circular arc R3 may also be calculated. That is, the central angle of the second circular arc R2 or the third circular arc R3 is equal to $(2\times(90°-\angle T_8T_9O_2))$.

In the embodiments, the central angle of the second circular arc R2 may be in the range of 30° to 40°, inclusive; and the central angle of the third circular arc R3 may also be in the range of 30° to 40°, inclusive.

Based on the solutions shown in FIGS. 5 and 6, for example, any one, included in the orthographic projection of the cutting section 121 on the plane where the substrate 1 is located, of the fourth circular arc R4 and the fifth circular arc R5 serves as a seventh circular arc, and a radius of the seventh circular arc is $r_4$. That is, referring to FIG. 7, a radius of the fourth circular arc R4 is r4, and/or a radius of the fifth circular arc R5 is r4. $r_4 = k_2 \cdot r_1$, where $k_2$ is in a range of 0.5 to 0.8, inclusive, and r1 is the radius of the first circular arc R1. With such a design, a smooth transition may be achieved between the first straight line segment L1 and the first circular arc R1, and/or between the second straight line segment L2 and the first circular arc R1, so that the cutting section 121 is less likely to have sharp corners.

A central angle of the fourth circular arc R4 may be in a range of 8° to 12°, inclusive; and a central angle of the fifth circular arc R5 may also be in the range of 8° to 12°, inclusive.

In some embodiments, the radius of the first circular arc R1 is in a range of 7.01 mm to 8.74 mm, inclusive; the radius of the second circular arc R2 is in a range of 0.15 mm to 0.3 mm, inclusive, and/or the radius of the third circular arc R3 is in the range of 0.15 mm to 0.3 mm, inclusive; the radius of the fourth circular arc R4 is in a range of 5 mm to 6 mm, inclusive, and/or the radius of the fifth circular arc R5 is in the range of 5 mm to 6 mm, inclusive; the length of the first straight line segment L1 is in a range of 0.3 mm to 0.52 mm, inclusive, and/or the length of the second straight line segment L2 is in the range of 0.3 mm to 0.52 mm, inclusive. With such a design, the cutting section of the substrate formed by cutting is less likely to have sharp corners, which improves smoothness of the cutting section of the substrate.

The first circular arc R1, the second circular arc R2, the third circular arc R3, the fourth circular arc R4, the fifth circular arc R5, the first straight line segment L1 and the second straight line segment L2 may be set in any one of the following manners.

In a first manner, the radius of the first circular arc R1 is about 7.78 mm; the radius of the second circular arc R2 is about 0.3 mm, and/or the radius of the third circular arc R3 is about 0.3 mm; the radius of the fourth circular arc R4 is about 5 mm, and/or the radius of the fifth circular arc R5 is about 5 mm; the length of the first straight line segment L1 is about 0.3 mm, and/or the length of the second straight line segment L2 is about 0.3 mm. Here, the term "about" refers to, in practical applications, a deviation of plus or minus ten percent of each given value.

In a second manner, the radius of the first circular arc R1 is about 7.93 mm; the radius of the second circular arc R2 is about 0.18 mm, and/or the radius of the third circular arc R3 is about 0.18 mm; the radius of the fourth circular arc R4 is about 6 mm, and/or the radius of the fifth circular arc R5 is about 6 mm; the length of the first straight line segment L1 is about 0.36 mm, and/or the length of the second straight line segment L2 is about 0.36 mm. Here, the term "about" refers to, in practical applications, a deviation of plus or minus ten percent of each given value.

In a third manner, the radius of the first circular arc R1 is about 8.74 mm; the radius of the second circular arc R2 is about 0.24 mm, and/or the radius of the third circular arc R3 is about 0.24 mm; the radius of the fourth circular arc R4 is about 6 mm, and/or the radius of the fifth circular arc R5 is about 6 mm; the length of the first straight line segment L1 is about 0.44 mm, and/or the length of the second straight line segment L2 is about 0.44 mm. Here, the term "about" refers to, in practical applications, a deviation of plus or minus ten percent of each given value.

In a fourth manner, the radius of the first circular arc R1 is about 7.41 mm; the radius of the second circular arc R2 is about 0.19 mm, and/or the radius of the third circular arc R3 is about 0.19 mm; the radius of the fourth circular arc R4 is about 5.5 mm, and/or the radius of the fifth circular arc R5 is about 5.5 mm; the length of the first straight line segment L1 is about 0.52 mm, and/or the length of the second straight line segment L2 is about 0.52 mm. Here, the term "about" refers to, in practical applications, a deviation of plus or minus ten percent of each given value.

In a fifth manner, the radius of the first circular arc R1 is about 7.01 mm; the radius of the second circular arc R2 is about 0.15 mm, and/or the radius of the third circular arc R3 is about 0.15 mm; the radius of the fourth circular arc R4 is about 5 mm, and/or the radius of the fifth circular arc R5 is about 5 mm; the length of the first straight line segment L1 is about 0.48 mm, and/or the length of the second straight line segment L2 is about 0.48 mm. Here, the term "about" refers to, in practical applications, a deviation of plus or minus ten percent of each given value.

Through the first manner to the fifth manner, widths of both ends of the corner to be removed of the substrate (i.e., widths of portions of the corner corresponding to the second circular arc R2 and the third circular arc R3) are relatively large, so that the stress distribution of the corner is relatively uniform when the corner is broken. Therefore, the phenomenon of stress concentration is less likely to occur. As a result, the corner may be better broken along the predetermined track, so that the breaking sections of the substrate 1 are less likely to have residues and burrs thereon.

Figure 8:
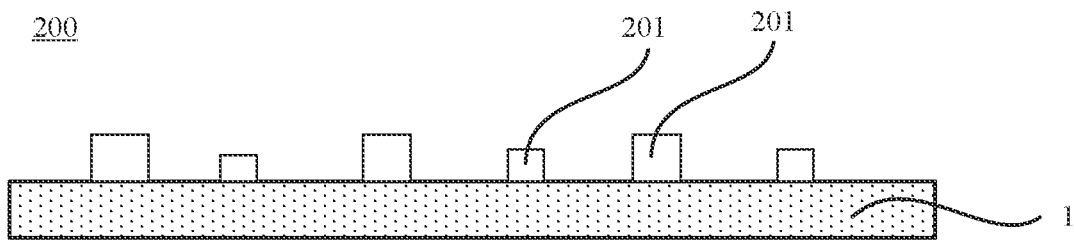
FIG. 8 is a flow diagram of a method for cutting a substrate, in accordance with some embodiments.

In another aspect, some embodiments of the present disclosure provide an electronic device 200. As shown in FIG. 8, the electronic device 200 includes the substrate described in any of the above embodiments. The substrate 1 is provided with electronic elements 201 therein. The electronic element 201 may be, for example, a thin film transistor or a capacitor, or may be an electrode or an electronic circuit. Alternatively, the electronic element 201 may be a combination of two or more of various electronic elements or structures.

The electronic device 200 may be any of a display panel, a touch panel, a micro-fluidic chip or an electronic chip, which is not limited in the embodiments of the present disclosure.

In a case where the electronic device 200 is the display panel, the display panel may be a liquid crystal display panel, an electroluminescent display panel or a photoluminescent display panel. For example, FIG. 9 schematically illustrates a case where the display panel is the liquid crystal display panel 01; and FIG. 10 schematically illustrates a case where the display panel is the electroluminescent display panel 03 or the photoluminescent display panel 03.

Figure 9:
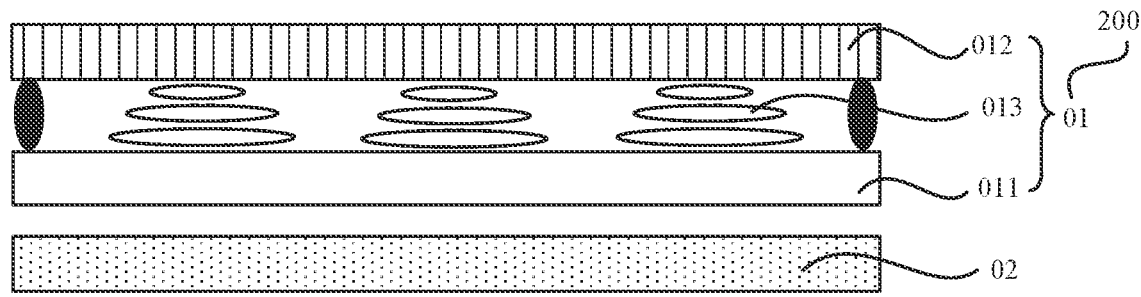
FIG. 9 is a structural diagram of a substrate motherboard, in accordance with some embodiments.

As shown in FIG. 9, in the case where the display panel is the liquid crystal display panel 01, a main structure of the liquid crystal display panel 01 includes an array substrate 011, an opposite substrate 012 and a liquid crystal layer 013 disposed between the array substrate 011 and the opposite substrate 012. The array substrate 011 and the opposite substrate 012 are assembled together by a frame sealant, so that the liquid crystal layer 013 is within a region enclosed by the frame sealant.

Figure 10:
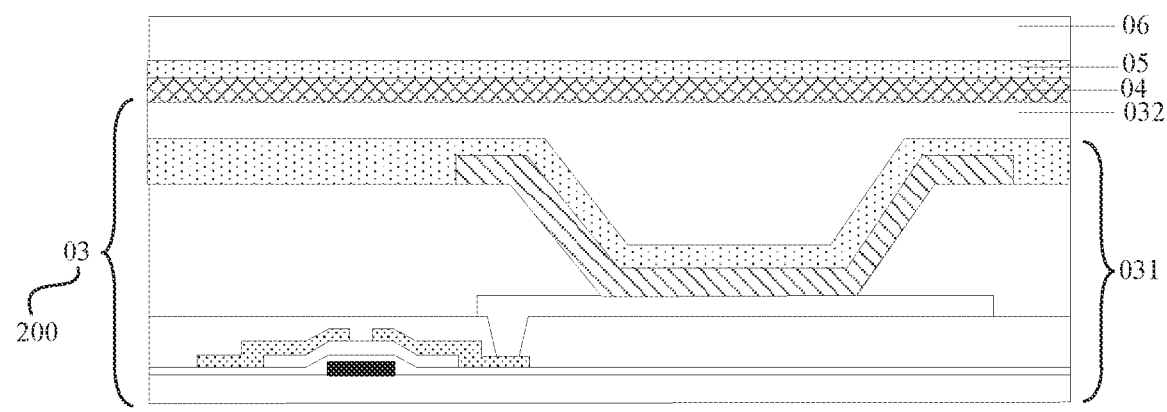
FIG. 10 is a structural diagram of a substrate whose corner(s) are to be removed, in accordance with some embodiments.

As shown in FIG. 10, in the case where the display panel is the electroluminescent display panel 03 or the photoluminescent display panel 03, a main structure of the electroluminescent display panel 03 or the photoluminescent display panel 03 includes a display substrate 031 and an encapsulation layer 032 for encapsulating the display substrate 031. Here, the encapsulation layer 032 may be an encapsulation film or an encapsulation substrate.

In yet another aspect, some embodiments of the present disclosure provide an electronic apparatus 300, referring to FIGS. 9 and 10, the electronic apparatus 300 includes the display device 200 as described in any of the above embodiments.

The electronic apparatus 300 may be a display apparatus. The display apparatus may be any product or component with a display function, such as an AR helmet, AR glasses, a mobile phone, a tablet computer, a television, a display, a notebook computer, a digital photo frame, or a navigator.

As shown in FIG. 9, the display apparatus may be a liquid crystal display (LCD) apparatus. As shown in FIG. 10, the display apparatus may be an electroluminescent display apparatus 302 or a photoluminescent display apparatus 302. In a case where the display apparatus is the electroluminescent display apparatus, the electroluminescent display apparatus may be an organic light-emitting diode (OLED) display apparatus, a quantum dot light-emitting diode (QLED) display apparatus or a small-sized light-emitting diode (e.g., Mini-LED or Micro-LED) display apparatus. In a case where the display apparatus is the photoluminescent display apparatus, the photoluminescent display apparatus may be a quantum dot photoluminescent display apparatus.

In the case where the display apparatus is the liquid crystal display apparatus, in some examples, as shown in FIG. 9, the display apparatus includes the liquid crystal display panel 01 and a backlight module 02. The backlight module is used for providing a light source for the liquid crystal panel 01, so that the liquid crystal panel 01 may normally display images.

In the case where the display apparatus is the electroluminescence display apparatus 302 or the photoluminescence display apparatus 302, in some examples, as shown in FIG. 10, the display apparatus includes the electroluminescent display panel 03 or the photoluminescent display panel 03, a polarizer 04, a first optically clear adhesive (OCA) 05 and a cover glass 02 that are arranged in sequence.

The electronic device and the electronic apparatus provided in the embodiments of the present disclosure each include the substrate 1 in any of the above embodiments. Therefore, the electronic device and the electronic apparatus have all the beneficial effects of the substrate 1, and it will not be repeated here.

In particular, in a case where the display apparatus is the television or a display apparatus with a relatively large display region (e.g., a dimension of the display region is greater than or equal to 10 inches), a thickness of the substrate is relatively large due to structural strength requirements of the apparatus. In this case, if laser light is used to cut the substrate, energy required by the laser light for cutting the substrate is relatively high, and light spots are relatively large. Therefore, it is necessary to set a large second limit value d to prevent the laser light from being reflected to the inside of the substrate 1 through an edge of the substrate when the laser light cuts to the edge of the substrate, so as to prevent the laser light from being reflected back and forth inside the substrate 1 and avoid product defects. For example, in the case where the display apparatus is the television or the display apparatus with the relatively large display region (e.g., the dimension of the display region is greater than or equal to 10 inches), the second limit value may be in a range of 0.1 mm to 0.3 mm, inclusive. For example, the second limit value may be set to increase with an area of the display region of the display apparatus.

In yet another aspect, some embodiments of the present disclosure provide a method for cutting a substrate.

Figure 11:
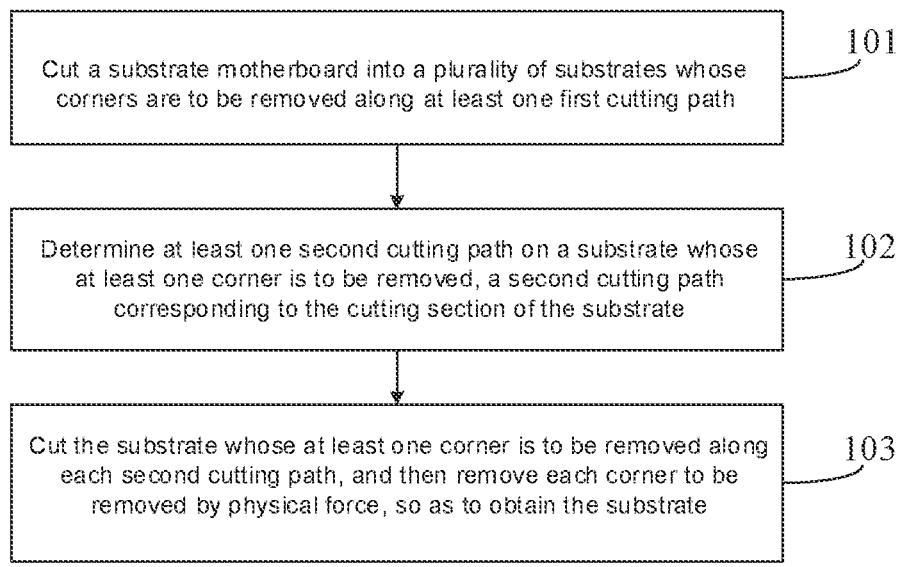
FIG. 11 is a structural diagram of an electronic device, in accordance with some embodiments.

Referring to FIG. 11, the cutting method includes steps 101 to 103 (S101 to S103).

In step 101, a substrate motherboard 100 is cut into a plurality of substrates 10 whose corners are to be removed along first cutting path(s) S1.

Figure 12:
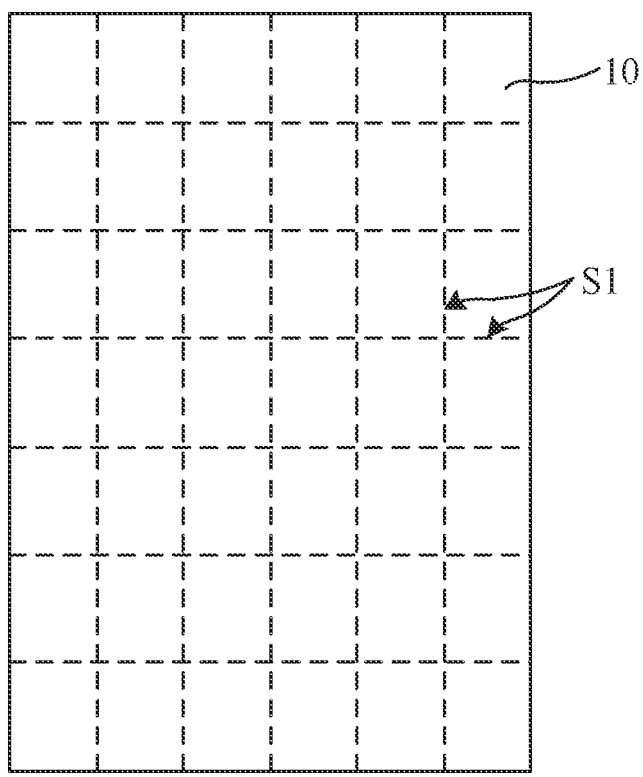
FIG. 12 is a structural diagram of an electronic apparatus, in accordance with some embodiments.

It will be noted that, the substrate motherboard 100 may be a motherboard formed by assembling an array substrate motherboard and an opposite substrate motherboard (e.g. an LCD panel motherboard); the substrate motherboard 100 may also be the array substrate motherboard or the opposite substrate motherboard. Of course, the substrate motherboard 100 may also be a self-luminous display substrate motherboard, or a substrate motherboard provided with electronic elements therein. This is not limited in the present disclosure. In some examples, referring to FIG. 12, a cutter wheel is used to cut the substrate motherboard 100 along the first cutting paths S1, so that the plurality of substrates 10 whose corners are to be removed are obtained.

Figure 13:
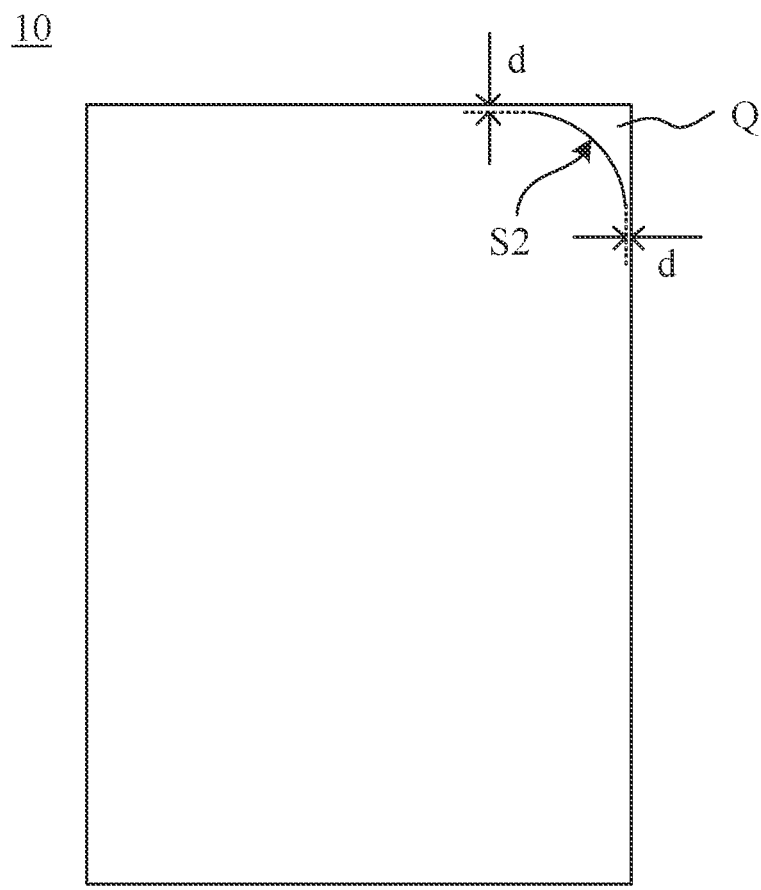
FIG. 13 is a structural diagram of another electronic apparatus, in accordance with some embodiments.

Referring to FIG. 13, for each substrate 10 whose corner(s) are to be removed, the substrate 10 whose corner(s) are to be removed has at least one corner Q. For example, as shown in FIG. 13, in a case where the substrate 10 whose corner(s) are to be removed has a rectangular shape, the substrate 10 whose corner(s) are to be removed may have four corners Q to be removed.

In step 102, as shown in FIG. 13, second cutting path(s) S2 are determined on the substrate 10 whose corner(s) are to be removed. A second cutting path S2 corresponds to the cutting section of the substrate 1 described in any of the above embodiments (e.g., the cutting section 121 shown in FIG. 1, 2, 3A, 3B, 4A, 4B, 5, 6 or 7). Here, the term "correspond" means that an orthographic projection of the second cutting path S2 on the plane where the substrate 1 is located overlaps with the orthographic projection of the cutting section 121 on the plane where the substrate 1 is located.

As shown in FIG. 13, gaps d exist between two end points of the second cutting path S2 and two edges respectively close thereto of the corner Q.

In step 103, the substrate 10 whose corner(s) are to be removed is cut along each second cutting path S2, and then the corner(s) Q to be removed of the substrate 10 are removed by physical force, so that the substrate 1 described in any of the above embodiments is obtained. It will be noted that, in some examples, Laser light may be used to cut the substrate 10 whose corner(s) are to be removed along the second cutting path S2. The physical force may be gravity, or force exerted by an external object (such as a human hand or a mechanical device).

With such a design, when the laser light is used to cut the corner Q to be removed of the substrate 10 along the second cutting path S2, there are gaps d between the two end points of the second cutting path S2 and the two edges respectively close thereto of the corner Q, so that the laser light will not be directed to the edges of the substrate 1, and the laser light will not be reflected to the inside of the substrate through the edges of the substrate 1. Therefore, the laser light will not be reflected back and forth inside the substrate 1, which may prevent the laser light from being reflected onto circuits in a peripheral region of the substrate 1. As a result, it is beneficial to prevent the circuits from being burned, which may reduce display defects of the product.

Moreover, in a case where the cutting section corresponding to the second cutting path S2 is the cutting section as shown in FIG. 3A, 3B, 4A, 4B, 5, 6, or 7, in the substrate 1 formed by the cutting method, breaking tracks of two breaking sections are closer to the predetermined track. That is, a corner portion that should be broken off is less likely to be remained on the breaking section, and a surface of the breaking section is less likely to have burrs thereon. As a result, cutting yield of the substrate is improved.

Figure 14:
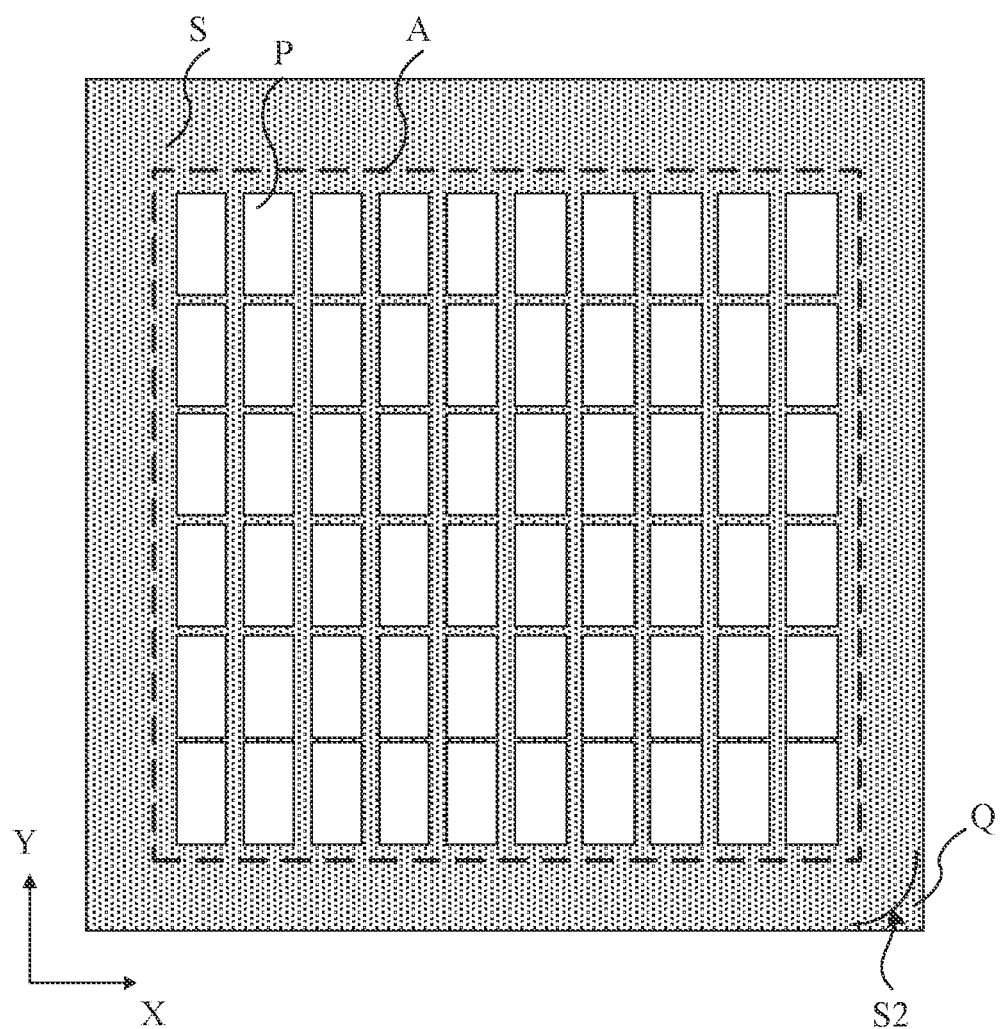
FIG. 14 is a structural diagram of a display panel, in accordance with some embodiments.

FIG. 14 shows a display panel to which the method for cutting the substrate may be directly applied. As shown in FIG. 14, the display panel has a display region A and a peripheral region S. FIG. 14 illustrates an example where the peripheral region S surrounds the display region A. The display region A is provided with a plurality of sub-pixels P therein. The peripheral region S is used for wiring, and gate driving circuit(s) may also be provided in the peripheral region S.

For the plurality of sub-pixels P disposed in the display region A, the embodiments of the present disclosure are described by taking an example in which the plurality of sub-pixels P are arranged in a matrix for convenience of description. In this case, sub-pixels P arranged in a line in a horizontal direction X are referred to as sub-pixels in a same row, and sub-pixels P arranged in a line in a vertical direction Y are referred to as sub-pixels in a same column. Sub-pixels in the same row may be connected to a gate line, and sub-pixels in the same column may be connected to a data line.

When the display panel is cut, it may be cut along a second cutting path S2 to remove a corner Q according to the method for cutting the substrate described in any of the above embodiments. In this way, laser light will not be reflected back and forth inside the display panel, and the laser light may be prevented from being reflected onto the circuits in the peripheral region of the display panel, which is beneficial to preventing the circuits from being burned and further reducing display defects of the product. Moreover, the corner Q may be better broken along the predetermined track. That is, a portion that should be broken off is less likely to be remained on a surface that is formed after the corner Q is removed, and the surface is less likely to have burrs thereon. As a result, cutting yield of the display panel is improved.

Figure 15:
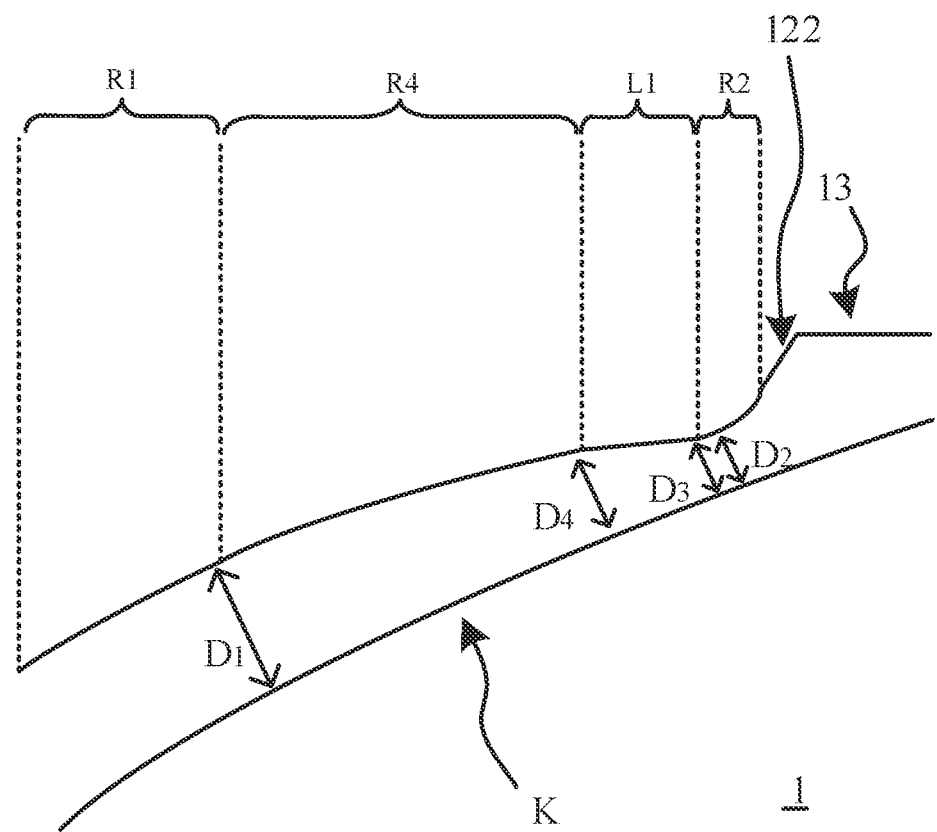
FIG. 15 is a structural diagram of another display panel, in accordance with some embodiments.

As shown in FIG. 15, the cut display panel further includes at least one metal wire K located in the display panel but at a periphery of the display panel. The metal wire K may be, for example, a grounding wire, an electromagnetic shielding wire, a gate line, or a data line. The metal wire K is disposed close to the cutting section, and there is no other wire between the metal wire K and the cutting section.

Any of points on the first circular arc R1 has a shortest distance to the metal wire K. By comparing shortest distances from the points on the first circular arc R1 to the metal wire K, a shortest distance D1 between the first circular arc R1 and the metal wire K may be obtained. In a case where the cut display panel has a structure as shown in FIG. 3A, the cutting section includes the second circular arc R2. Any of points on the second circular arc R2 has a shortest distance to the metal wire K. By comparing shortest distances from the points on the second circular arc R2 to the metal wire K, a shortest distance D2 between the second circular arc R2 and the metal wire K may be obtained. A positional relationship between the metal wire K and the cutting section is as follows: D1>D2. Since a position near a center of an end portion is relatively fragile and easy to be broken or cracked compared with other positions of the end portion, the cut display panel may obtain a relatively large "safety distance for electronic elements" in a region close to the center of the end portion with such a structural design. That is, in the region close to the center of the end portion, distances between the cutting section and the electronic elements of the display panel are relatively far, and thus it may reduce impact on the display function and service life of the display panel due to breaking of the end portion or crack(s) on the end portion, and improve reliability of the display panel.

For example, in a case where the cutting section further includes the first straight line segment L1, similar to a definition of the shortest distance between the first circular arc R1 and the metal wire K, a shortest distance between the first straight line segment L1 and the metal wire K is D3. A positional relationship between the metal wire K and the cutting section is as follows: D1>D3.

For example, in a case where the cutting section further includes the fourth circular arc R4, similar to the definition of the shortest distance between the first circular arc R1 and the metal wire K, a shortest distance between the fourth circular arc R4 and the metal wire K is D4. A positional relationship between the metal wire K and the cutting section is as follows: D1>D4.

For example, as shown in FIG. 15, in a case where the cutting section includes the second circular arc R2, the first straight line segment L1, and the fourth circular arc R4, similar to the definition of the shortest distance between the first circular arc R1 and the metal wire K, shortest distances from the second circular arc R2, the first straight line segment L1 and the fourth circular arc R4 to the metal wire K are D2, D3, and D4, respectively. A positional relationship between the metal wire K and the cutting section is as follows: D1>max(D2, D3, D4), where max(D2, D3, D4) represents a maximum value in D2, D3, and D4.

For example, in a case where the cutting section includes the third circular arc R3, similar to the definition of the shortest distance between the first circular arc R1 and the metal wire K, a shortest distance between the third circular arc R3 and the metal wire K is D2'. A positional relationship between the metal wire K and the cutting section is as follows: D1>D2'.

For example, in a case where the cutting section further includes the second straight line segment L2, similar to the definition of the shortest distance between the first circular arc R1 and the metal wire K, a shortest distance between the second straight line segment L2 and the metal wire K is D3'. A positional relationship between the metal wire K and the cutting section is as follows: D1>D3'.

For example, in a case where the cutting section further includes the fifth circular arc R5, similar to the definition of the shortest distance between the first circular arc R1 and the metal wire K, a shortest distance between the fifth circular arc R5 and the metal wire K is D4'. A positional relationship between the metal wire K and the cutting section is as follows: D1>D4'.

For example, in a case where the cutting section includes the third circular arc R3, the second straight line segment L2, and the fifth circular arc R5, similar to the definition of the shortest distance between the first circular arc R1 and the metal wire K, shortest distances from the third circular arc R3, the second straight line segment L2 and the fifth circular arc R5 to the metal wire K are D2', D3', D4' respectively. A positional relationship between the metal wire K and the cutting section is as follows: D1>max(D2', D3', D4'), where max(D2', D3', D4') represents a maximum value in D2', D3', and D4'.

With such a structural design, based on a same principle, a panel structure given in the above examples enables the cut display panel to obtain a relatively large "safety distance for electronic elements" in the region close to the center of the end portion. That is, in the region close to the center of the end portion, distances between the cutting section and the electronic elements of the display panel are relatively far, and thus it may reduce impact on the display function and service life of the display panel due to the breaking of the end portion or the crack(s) on the end portion, and improve reliability of the display panel.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A substrate, comprising:
   at least two edges; and,
   at least one end portion, each end portion being connected to two adjacent edges, wherein
   the end portion includes a cutting section and two breaking sections; an end of the cutting section is connected to one of the two adjacent edges through a breaking section, and another end of the cutting section is connected to another one of the two adjacent edges through another breaking section;
   the cutting section is configured to be formed through cutting of a tool, and the breaking sections are configured to be formed under an action of a physical force;
   wherein an orthographic projection of the cutting section on a plane where the substrate is located includes:
   a first circular arc, an arc center of the first circular arc being located at an inside of the substrate; and
   at least one of a second circular arc and a third circular arc, wherein
   a first end of the second circular arc is connected to an orthographic projection of a breaking section of the two breaking sections on the plane where the substrate is located, and a second end of the second circular arc is directly or indirectly connected to a first end of the first circular arc;
   an arc center of the second circular arc is located at an outside of the substrate; and
   a first end of the third circular arc is connected to an orthographic projection of another breaking section of the two breaking sections on the plane where the substrate is located, and a second end of the third circular arc is directly or indirectly connected to a second end of the first circular arc; an arc center of the third circular arc is located at an outside of the substrate;
   wherein the first circular arc, the second circular arc and the third circular arc are located in an orthographic projection of a same end portion on the plane where the substrate is located.

2. The substrate according to claim 1, wherein the at least one of the second circular arc and the third circular arc is directly connected to the first circular arc; any one, included in the orthographic projection of the cutting section on the plane where the substrate is located, of the second circular arc and the third circular arc serves as a sixth circular arc, a radius of the sixth circular arc is $r_{21}$, and $r_{21}$ satisfies a following formula:

$$r_{21} = k_1 \cdot \sqrt{2} \cdot s \cdot \tan\left[\frac{225° - \arcsin\left(\frac{r_1 \cdot \cos(45° - \alpha/2) - s}{r_1}\right)}{2}\right],$$

where $k_1$ is in a range of 1 to 2, inclusive; $r_1$ is a radius of the first circular arc; s is a first limit value; $\alpha$ is a central angle corresponding to an auxiliary circular arc, the auxiliary circular arc is obtained by extending the first circular arc, and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value.

3. The substrate according to claim 1, wherein the at least one of the second circular arc and the third circular arc is indirectly connected to the first circular arc; and
   the orthographic projection of the cutting section on the plane where the substrate is located further includes at least one of a first straight line segment and a second straight line segment, wherein
   a first end of the first straight line segment is connected to the second end of the second circular arc, and a second end of the first straight line segment is connected to the first end of the first circular arc; and
   a first end of the second straight line segment is connected to the second end of the third circular arc, and a second end of the second straight line segment is connected to the second end of the first circular arc.

4. The substrate according to claim 3, wherein the orthographic projection of the cutting section on the plane where the substrate is located includes the second circular arc and the first straight line segment, the first straight line segment is tangent to both the second circular arc and the first circular arc; or
   the orthographic projection of the cutting section on the plane where the substrate is located includes the third circular arc and the second straight line segment, the second straight line segment is tangent to both the third circular arc and the first circular arc; or
   the orthographic projection of the cutting section on the plane where the substrate is located includes the second circular arc, the third circular arc, the first straight line segment and the second straight line segment, the first straight line segment is tangent to both the second circular arc and the first circular arc, and the second straight line segment is tangent to both the third circular arc and the first circular arc.

5. The substrate according to claim 3, wherein any one, included in the orthographic projection of the cutting section on the plane where the substrate is located, of the second circular arc and the third circular arc serves as a sixth circular arc, a radius of the sixth circular arc is $r_{22}$, and $r_{22}$ satisfies a following formula:

$$r_{22} = k_1 \cdot \sqrt{2} \cdot s \cdot \tan\frac{1}{2}\left(135° + \arctan\frac{u}{\sqrt{r_1^2 - [r_1 \cdot \cos(45° - \alpha/2) - s - u]^2} - \sqrt{r_1^2 - [r_1 \cdot \cos(45° - \alpha/2) - s]^2}}\right),$$

where $k_1$ is in a range of 1 to 2, inclusive; $r_1$ is a radius of the first circular arc; s is a first limit value; $\alpha$ is a central angle corresponding to an auxiliary circular arc, the auxiliary circular arc is obtained by extending the first circular arc; and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value; and u is a third limit value.

6. The substrate according to claim 1, wherein the at least one of the second circular arc and the third circular arc is indirectly connected to the first circular arc; and the orthographic projection of the cutting section on the plane where the substrate is located further includes at least one of a fourth circular arc and a fifth circular arc, wherein a first end of the fourth circular arc is connected to the second end of the second circular arc, and a second end of the fourth circular arc is connected to the first end of the first circular arc; and a first end of the fifth circular arc is connected to the second end of the third circular arc, and a second end of the fifth circular arc is connected to the second end of the first circular arc.

7. The substrate according to claim 6, wherein the orthographic projection of the cutting section on the plane where the substrate is located includes the second circular arc and the fourth circular arc, the fourth circular arc is internally tangent to the first circular arc, and the fourth circular arc is externally tangent to the second circular arc; or the orthographic projection of the cutting section on the plane where the substrate is located includes the third circular arc and the fifth circular arc, the fifth circular arc is internally tangent to the first circular arc, and the fifth circular arc is externally tangent to the third circular arc; or the orthographic projection of the cutting section on the plane where the substrate is located includes the second circular arc, the third circular arc, the fourth circular arc and the fifth circular arc; the fourth circular arc is internally tangent to the first circular arc, and the fourth circular arc is externally tangent to the second circular arc; the fifth circular arc is internally tangent to the first circular arc, and the fifth circular arc is externally tangent to the third circular arc.

8. The substrate according to claim 1, wherein the at least one of the second circular arc and the third circular arc is indirectly connected to the first circular arc; and the orthographic projection of the cutting section on the plane where the substrate is located further includes at least one of a group consisting of a first straight line segment and a fourth circular arc and another group consisting of a second straight line segment and a fifth circular arc;

a first end of the first straight line segment is connected to the second end of the second circular arc, a second end of the first straight line segment is connected to a first end of the fourth circular arc, and a second end of the fourth circular arc is connected to the first end of the first circular arc; and a first end of the second straight line segment is connected to the second end of the third circular arc, and a second end of the second straight line segment is connected to a first end of the fifth circular arc, a second end of the fifth circular arc is connected to the second end of the first circular arc.

9. The substrate of claim 8, wherein the orthographic projection of the cutting section on the plane where the substrate is located includes the second circular arc, the fourth circular arc and the first straight line segment; the first straight line segment is tangent to both the second circular arc and the fourth circular arc, and the fourth circular arc is internally tangent to the first circular arc; or the orthographic projection of the cutting section on the plane where the substrate is located includes the third circular arc, the fifth circular arc and the second straight line segment; the second straight line segment is tangent to both the third circular arc and the fifth circular arc, and the fifth circular arc is internally tangent to the first circular arc; or the orthographic projection of the cutting section on the plane where the substrate is located includes the second circular arc, the third circular arc, the fourth circular arc, the fifth circular arc, the first straight line segment and the second straight line segment; the first straight line segment is tangent to both the second circular arc and the fourth circular arc, the fourth circular arc is internally tangent to the first circular arc; and the second straight line segment is tangent to both the third circular arc and the fifth circular arc, and the fifth circular arc is internally tangent to the first circular arc.

10. The substrate according to claim 6, wherein any one, included in the orthographic projection of the cutting section on the plane where the substrate is located, of the second circular arc and the third circular arc serves as a sixth circular arc, a radius of the sixth circular arc is $r_{23}$, and $r_{23}$ satisfies a following formula:

$$r_{23} = k_1 \cdot n \cdot \tan\left\{\frac{270° - \arccos\left[\frac{(r_1-s)^2 + n^2 - r_1^2}{2n \cdot (r_1-s)}\right]}{2}\right\},$$

where $k_1$ is in a range of 1 to 2, inclusive; n is a minimum value of L in a formula $$\cos\left(90° - \frac{\alpha}{2}\right) = \frac{r_1^2 + L^2 - (r_1-s)^2}{2L \cdot r_1};$$

α is a central angle corresponding to an auxiliary circular arc, the auxiliary circular arc is obtained by extending the first circular arc, and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value; $r_1$ is a radius of the first circular arc, and s is a first limit value.

11. The substrate according to claim 6, wherein any one, included in the orthographic projection of the cutting section on the plane where the substrate is located, of the fourth circular arc and the fifth circular arc serves as a seventh circular arc, a radius of the seventh circular arc is $r_4$, and $r=k_2 \cdot r_1$; where $k_2$ is in a range of 0.5 to 0.8, inclusive; and $r_1$ is a radius of the first circular arc.

12. The substrate according to claim 1, wherein a shortest distance between each point on a portion of the orthographic projection, on the plane where the substrate is located, of the cutting section except the first circular arc and a circle where the first circular arc is located is less than or equal to a first limit value.

13. The substrate according to claim 1, wherein a dimension of a breaking section of the two breaking sections in a first direction is a second limit value, the first direction being a direction parallel to the plane where the substrate is located and perpendicular to an edge of the two adjacent edges that is connected to the breaking section; and
a dimension of another breaking section of the two breaking sections in a second direction is the second limit value, and the second direction is a direction parallel to the plane where the substrate is located and perpendicular to another edge of the two adjacent edges that is connected to the another breaking section.

14. An electronic device, comprising:
at least one substrate according to claim 1.

15. The electronic device according to claim 14, wherein the electronic device is a display panel, the display panel further comprises:
at least one metal wire disposed in the display panel and located at a periphery of the display panel, wherein
an orthographic projection of the cutting section of the substrate on the plane where the substrate is located includes a first circular arc and a second circular arc, a shortest distance between the first circular arc and a metal wire is greater than a shortest distance between the second circular arc and the metal wire; and/or
an orthographic projection of the cutting section of the substrate on the plane where the substrate is located includes a first circular arc and a third circular arc, a shortest distance between the first circular arc and a metal wire is greater than a shortest distance between the third arc and the metal wire; and/or
an orthographic projection of the cutting section of the substrate on the plane where the substrate is located includes a first circular arc and a first straight line segment, a shortest distance between the first circular arc and a metal wire is greater than a shortest distance between the first straight line segment and the metal wire; and/or
an orthographic projection of the cutting section of the substrate on the plane where the substrate is located includes a first circular arc and a second straight line segment, a shortest distance between the first circular arc and a metal wire is greater than a shortest distance between the second straight line segment and the metal wire; and/or
an orthographic projection of the cutting section of the substrate on the plane where the substrate is located includes a first circular arc and a fourth circular arc, a shortest distance between the first circular arc and a metal wire is greater than a shortest distance between the fourth arc and the metal wire; and/or
an orthographic projection of the cutting section of the substrate on the plane where the substrate is located includes a first circular arc and a fifth circular arc, a shortest distance between the first circular arc and a metal wire is greater than a shortest distance between the fifth arc and the metal wire.

16. An electronic apparatus, comprising:
the electronic device according to claim 14.

17. A method for cutting a substrate, comprising:
cutting a substrate motherboard into a plurality of substrates whose corners are to be removed along at least one first cutting path;
determining at least one second cutting path on a substrate whose at least one corner is to be removed, wherein a second cutting path corresponding to the cutting section of the substrate according to claim 1; and
cutting the substrate whose at least one corner is to be removed along each second cutting path, and then removing each corner to be removed by physical force, so as to obtain the substrate according to claim 1.

18. The substrate according to claim 8, wherein any one, included in the orthographic projection of the cutting section on the plane where the substrate is located, of the second circular arc and the third circular arc serves as a sixth circular arc, a radius of the sixth circular arc is $r_{23}$, and $r_{23}$ satisfies a following formula:

$$r_{23} = k_1 \cdot n \cdot \tan\left\{\frac{270° - \arccos\left[\frac{(r_1 - s)^2 + n^2 - r_1^2}{2n \cdot (r_1 - s)}\right]}{2}\right\},$$

where $k_1$ is in a range of 1 to 2, inclusive; n is a minimum value of L in a formula $$\cos\left(90° - \frac{\alpha}{2}\right) = \frac{r_1^2 + L^2 - (r_1 - s)^2}{2L \cdot r_1};$$

α is a central angle corresponding to an auxiliary circular arc, the auxiliary circular arc is obtained by extending the first circular arc, and a distance from an end of two opposite ends of the auxiliary circular arc to an edge, adjacent to the end, of the two adjacent edges and a distance from another end of the two opposite ends of the auxiliary circular arc to another edge, adjacent to the another end, of the two adjacent edges are each equal to a second limit value; $r_1$ is a radius of the first circular arc, and s is a first limit value; or
any one, included in the orthographic projection of the cutting section on the plane where the substrate is located, of the fourth circular arc and the fifth circular arc serves as a seventh circular arc, a radius of the seventh circular arc is $r_4$, and $r_4 k_2 \cdot r_1$; where $k_2$ is in a range of 0.5 to 0.8, inclusive; and $r_1$ is a radius of the first circular arc.

* * * * *